United States Patent [19]

Kimbara

[11] Patent Number: 5,164,892
[45] Date of Patent: Nov. 17, 1992

[54] PULSE ELECTRIC POWER UNIT

[75] Inventor: Yoshihide Kimbara, Aichi, Japan

[73] Assignee: Mitsubishi Denki Kabushiki Kaisha, Tokyo, Japan

[21] Appl. No.: 608,861

[22] Filed: Nov. 5, 1990

[30] Foreign Application Priority Data

Jan. 31, 1990 [JP] Japan .................... 2-20606

[51] Int. Cl.⁵ .......................... H02M 3/145
[52] U.S. Cl. ........................ 363/131; 363/16; 363/135; 323/224; 328/67; 307/268
[58] Field of Search ........... 363/124, 131, 16, 135; 328/67; 307/268, 571, 584; 315/244; 323/222, 224, 266

[56] References Cited

U.S. PATENT DOCUMENTS

| | | | |
|---|---|---|---|
| 3,323,076 | 5/1967 | Pelly | 331/117 |
| 3,543,130 | 11/1970 | Reijnders | 363/28 |
| 3,573,598 | 4/1971 | Clarke | 363/27 |
| 4,072,842 | 2/1978 | Ullmann et al. | |
| 4,184,197 | 1/1980 | Cuk et al. | |
| 4,868,730 | 9/1989 | Ward | 363/21 |
| 5,083,001 | 1/1992 | Kinbara | 219/69.180 |

FOREIGN PATENT DOCUMENTS 61-277367 5/1987 Japan .
63-154067 11/1988 Japan .

OTHER PUBLICATIONS

Resonant Switches, Liu and Lee, IEEE 1984 pp. 344-351.
J. J. Jozwik et al., "Dual Sepic PWM Switching-Mode DC/DC Power Converter", IEEE Transactions on Industrial Electroniks, vol. 36, No. 1, Feb. 1989, pp. 64-70.
B. Stadler, "Die Ladungstransformation, eine Methode zur Aufladung kapazitiver Speicher fur Impulsanwendungen", etz Archiv, Band 2, 1980, Heft 1, Seiten 25-27.

Primary Examiner—Steven L. Stephan
Assistant Examiner—Adolf Berhane
Attorney, Agent, or Firm—Rothwell, Figg, Ernst & Kurz

[57] ABSTRACT

A pulse electric power unit according to this invention performs a switching control of output current from a direct current power supply by means of an electronically-operated switch to thereby effect a voltage conversion for producing a voltage having the polarity opposite to that of a direct current voltage by causing a direct current voltage of the direct current power supply to vary, or producing a voltage having the same polarity as that of the direct current voltage by boosting and/or unboosting the direct current voltage or producing a voltage having the same polarity as that of the direct current voltage by boosting the direct current voltage. This pulse electric power unit can prevent improper current from occurring by means of a reverse-current blocking diode for blocking a capacitor from being discharged and can output pulse current having a quick rise/fall characteristic.

2 Claims, 20 Drawing Sheets

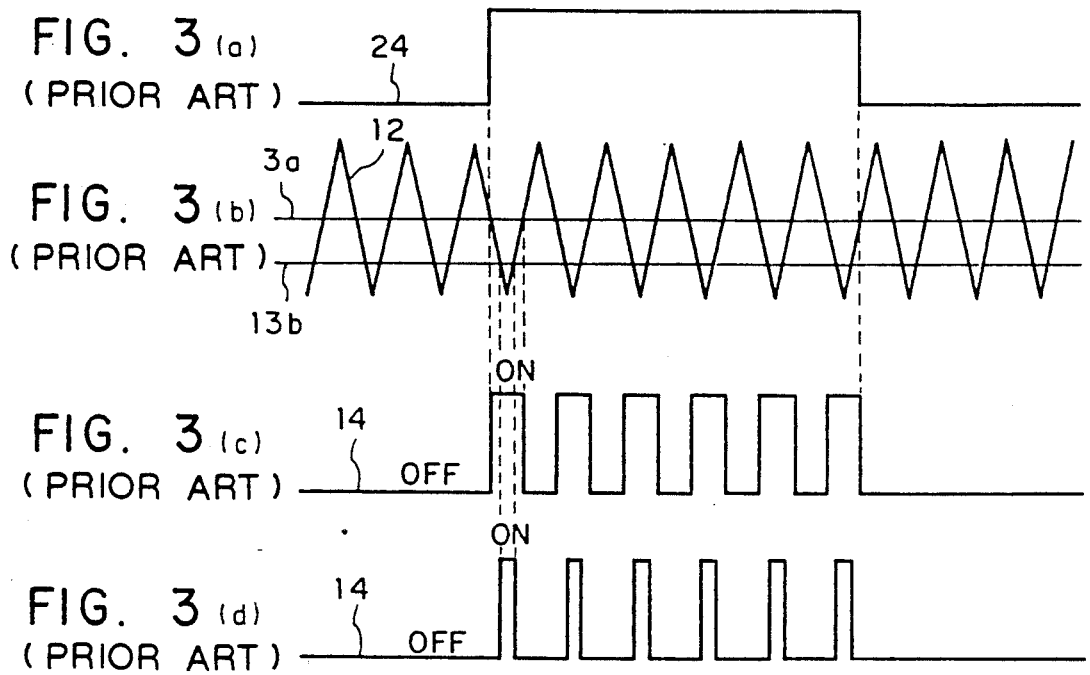
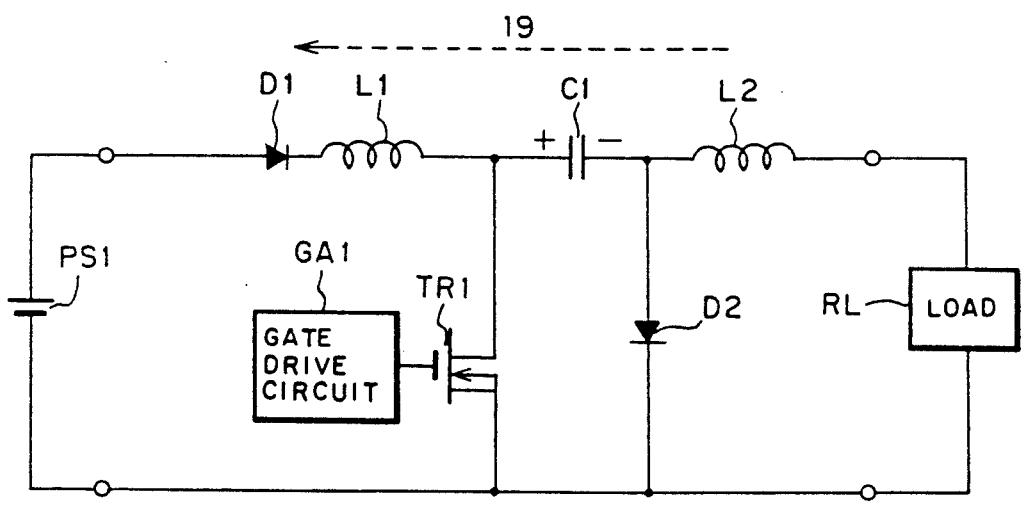

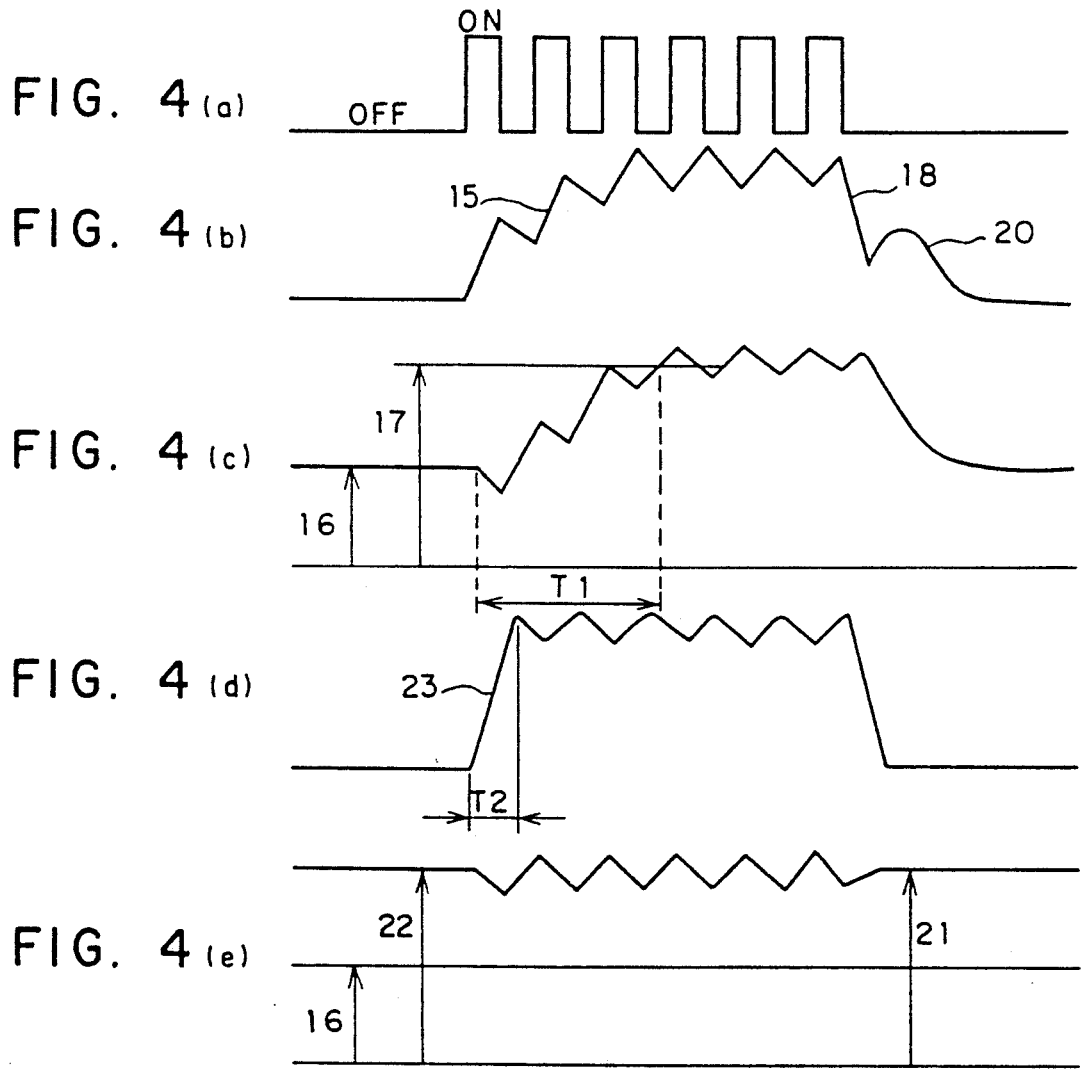

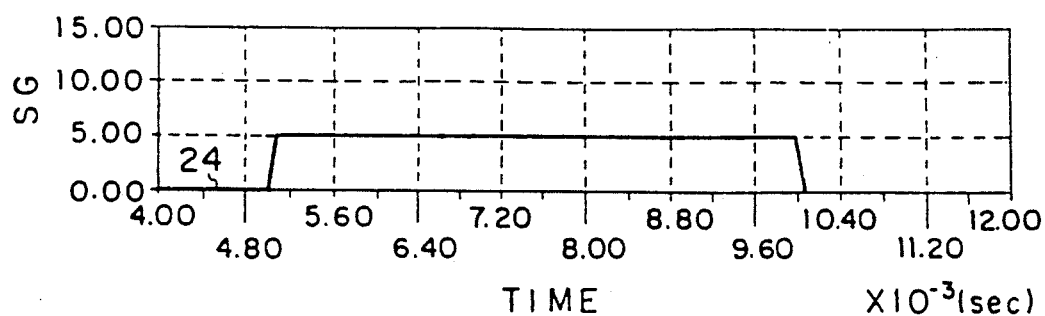
FIG. 5(a)
(PRIOR ART)
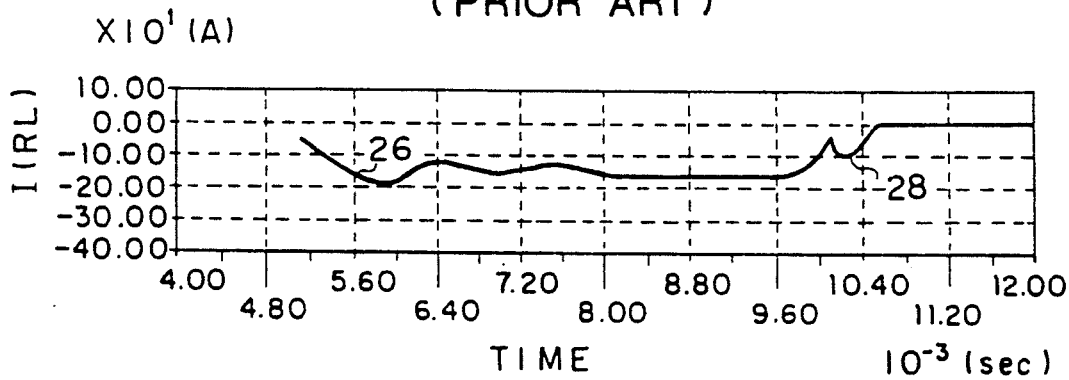
FIG. 5(b)
(PRIOR ART)
FIG. 5(c)
(PRIOR ART)
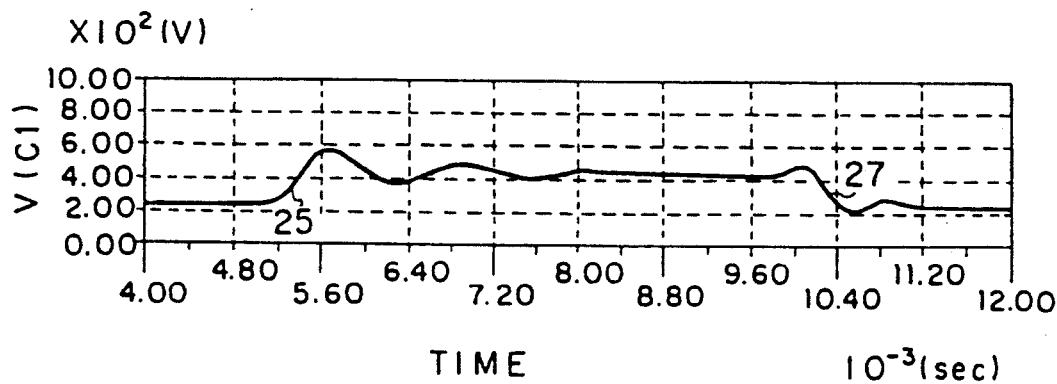

FIG. 16(e)

PULSE ELECTRIC POWER UNIT

BACKGROUND OF THE INVENTION (1) Field of the Invention

The present invention relates to an improvement in a pulse electric power unit provided with a direct current power converter for converting an output voltage from a direct current power supply into a direct current voltage having arbitrary magnitude.

(2) Description of the Related Art

FIG. 1 is a circuit diagram showing the structure of a pulse electric power unit of a type wherein a Cuk converter employed as a conventional direct current power converter is pulse-operated to output pulse current. In the same drawing, there are shown a direct current power supply PS1, reactors L1, L2, a capacitor C1, a diode D2, a transistor TR1, a gate drive circuit GA1, a load RL, an output voltage V1 of the direct current power supply PS1, an output voltage V2 of the load RL, currents 1 through 4, and discharge current 19 of the capacitor C1. In FIG. 1, a description will now be made in a case where the transistor TR1 is a MOS (Metal-Oxide-Semiconductor) field-effect transistor (MOSFET) by an illustrative example. However, other semiconductor switching devices such as an IGBT (Insulated-gate Bipolar Transistor), an electrostatic induction type transistor, an electrostatic induction type thyristor, a GOT (Gate turn-off) thyristor, etc. will be described in the same manner as referred to above.

A description will now be made of the operation of the conventional pulse electric power unit shown in FIG. 1. When the transistor TR1 whose conductivity is controlled by the gate drive circuit GA1 is turned on, the current 1 indicated by the arrow flows through the reactor L1 connected to the direct current power supply PS1. On the other hand, when the transistor TR1 is turned off, the current 1 indicated by the arrow is switched to the current 2, which in turn charges the capacitor C1 and flows into the diode D2.

When the transistor TR1 is turned on again, the current 1 is further increased, so that the current 3 indicated by the arrow flows into the transistor TR1 through the reactor L2 and the capacitor C1. At this time, the current 3 flows into the load RL, so that the power conversion is effected.

Further, when the transistor TR1 is turned off, the increased current 1 is changed to the current 2, which in turn charges the capacitor C1. In addition, the current 3, which flows through the reactor L2 is changed to the current 4 indicated by the arrow, and the current 4 flows into the load RL in succession. The Cuk converter is operated in the above-described manner to effect direct current power conversion. When the Cuk converter is in operation, the capacitor C1 is charged so as to be the polarity shown in FIG. 1. The voltage stored in the capacitor C1 becomes equal to the sum of the output voltage V1 of the direct current power supply PS1 and the output voltage V2 applied across the load RL.

FIG. 2 is a block diagram showing the structure of a control circuit for pulse-operating the Cuk converter of FIG. 1. In the same drawing, there are shown a triangular-wave signal generator 5, a command control unit 6, a pulse signal generator 7, switches 8, 9, an inverter 10, a comparator 11, a gate drive circuit GA1, signals 12 through 14, and a pulse signal 24.

FIG. 3 is a timing chart for describing the operation of the control circuit of FIG. 2 for pulse-operating the Cuk converter, the chart showing signals employed in respective parts of the control circuit. In the same drawing, designated at numerals 12, 13a, 13b, 14 are signals and numeral 24 indicates the pulse signal.

In the control circuit shown in FIG. 2, the triangular-wave signal generator 5 generates a triangular-wave signal 12 shown in FIG. 3(b). The command control unit 6 produces a voltage corresponding to the conductivity of the transistor TR1 (see FIG. 1). The pulse signal generator 7 generates the pulse signal 24 shown in FIG. 3(a), which in turn actuates the inverter 10 to thereby open or close the switches 8, 9 alternately. The comparator 11 compares the signal from the triangular-wave signal generator 5 with the signal 13 from the command control unit 6 and outputs the signal 14 for making conductive the transistor TR1 to the gate drive circuit GA1. The signal 14 to be outputted to this gate drive circuit GA1 will be shown in FIGS. 3(c) and 3(d). FIG. 3(c) shows the signal 14 obtained when the command control unit 6 outputs the signal 13a depicted in FIG. 3(b), while FIG. 3(d) illustrates the signal 14 obtained when the command control unit 6 outputs the signal 13b shown in FIG. 3(b). However, when the level of the signal outputted from the command control unit 6 is reduced, the conductivity of the transistor TR1 becomes small so that the output power to be delivered to the load RL is lowered.

Since the pulse electric power unit employing the conventional Cuk converter is constructed as described above, such problems as will be described subsequently exist.

FIG. 4 is a timing chart for comparing the operation of the pulse electric power unit employing the conventional Cuk converter with that of a pulse electric power unit according to one embodiment of this invention to thereby describe the comparison result, the chart showing signals employed in individual parts of both power units. In the same drawing, designated at numerals 15, 18, 20 are output currents of the transistor TR1 and numerals 16, 17, 21, 22 indicate voltages stored in the capacitor C1. Numeral 23 indicates output current which flows into the load RL.

FIG. 4(a) shows an operation characteristic obtained when the transistor TR1 is turned on and off. When the pulse signal generator 7 shown in FIG. 2 is turned on to output an ON signal (the pulse signal 24) therefrom, the switching operation of the transistor TR1 is made in response to the signal shown in FIG. 4(a). As a consequence, the output current 15 from the transistor TR1 is increased as illustrated in FIG. 4(b). Further, a voltage stored in the capacitor C1 rises up to the voltage 17 as depicted in FIG. 4(c). Thus, the time required to charge the capacitor C1 is equal to the time T1 required for the output current 15 of the transistor TR1 to rise. The transistor TR1 should have the switching operations of 5 to 20 times in order to charge the capacitor C1. Therefore, the rise time T1 of the output current 15 becomes slow or long.

On the other hand, when the pulse signal generator 7 is turned off to output an OFF signal therefrom, the switching operation of the transistor TR1 is stopped in response to the signal shown in FIG. 4(a). As a result, the output current 18 of the transistor Tr1 is reduced as shown in FIG. 4(b). With this operation, a voltage stored in the capacitor C1 is reduced to the voltage 16 from the voltage 17 as illustrated in FIG. 4(c). This results from the fact that the switching operation of the transistor TR1 is stopped and at the same time, discharge current 19 indicated by the arrow (broken line) in FIG. 1 flows, so that the voltage stored in the capacitor C1 is discharged. The irregular or improper current 20 occurs as shown in FIG. 4(b) because the discharge current 19 flows through the load RL. Such improper output current 20 shows an output-current waveform different from that of the signal 13 outputted from the command control unit 6.

FIG. 5 is a timing chart for describing the operations effected when the pulse electric power unit shown in FIG. 1 is practically actuated, the chart showing signals employed in respective parts of the pulse electric power unit. In the same drawing, designated at numeral 24 is a pulse signal. Numerals 25, 27 designate voltages stored in the capacitor C1 and numerals 26, 28 indicate currents which flow into the load RL. At this case, a voltage 25 necessary to charge the capacitor C1 with respect to the pulse signal 24 shown in FIG. 5(a) is shown in FIG. 5(c) under the condition of operation that a frequency of a signal 12 from a triangular-wave signal generator 5 is 20 KHz, the inductance of each of the reactors L1, L2 is 100 $\mu$H, the capacitance of the capacitor C1 is 100 $\mu$F, the output voltage of the direct current power supply PS1 is 230 V, the resistance of the load RL is 1.5 $\Omega$, and the electric conductivity of the transistor TR1 is 50%. The time required to charge the capacitor C1 at the time that the voltage 25 rises is about 0.5 msec. As shown in FIG. 5(b), the output current 26 at the load RL also rises in the same manner as described above. The voltage 27 stored in the capacitor C1 at the time that it falls is shown in FIG. 5(c). At this time, the output voltage of the direct current power supply PS1 is reduced to 230 V. At the same time, improper proper current flows into the load RL owing to the presence of the improper output current 28 shown in FIG. 5(b) which flows in the load RL.

In order to adopt the Ćuk converter as being used to illuminate an arc lamp for the YAG laser excitation or to perform an electric discharge between an electrode on the side of a discharge machining apparatus and an object or workpiece to be machined, the Ćuk converter should have a high-speed response characteristic. Further, when the improper current flows into the load, the normal power of a laser beam cannot be produced. Furthermore, the converter fails to produce a normal discharge between the electrode and the workpiece side.

Accordingly, the conventional Ćuk converter is unfit for the pulse electric power unit to illuminate the arc lamp for the YAG laser excitation or for the pulse electric power unit to supply the proper current to the electrode-workpiece interval. Thus, such a Ćuk converter has not been put to use.

As has been described above, the above-described Ćuk converter is accompanied by a problem that inconvenience such as a slow rise in output current from the Ćuk converter and occurrence of improper output current at the time that the output current falls is developed. The Ćuk converter is accompanied by another problem that the response speed is slow where it is employed as a pulse electric power unit necessary to have high-speed response as particularly in the pulse electric power unit used to illuminate the arc lamp for the YAG laser excitation or in the pulse electric power unit used to provide the proper current between the electrode on the side of the discharge machining apparatus and the workpiece to be machined.

SUMMARY OF THE INVENTION

With the foregoing problems in view, it is an object of this invention to provide a pulse electric power unit which permits high-speed response without particularly causing improper current to occur in output current.

According to a first aspect of this invention, there is provided a pulse electric power unit comprising a direct current power converter including circuit components which comprise a first diode, a first reactor and an electronically-operated switch, the first diode, the first reactor and the electronically-operated switch being serially connected in turn from a high-potential side to a low-potential side with connected structure composed of a capacitor and a second diode which are connected in parallel with the electronically-operated switch; and a serially-connected structure composed of a second reactor and a load which are connected in parallel with the second diode. The output current from the direct current power converter is controlled at intervals by means of the electronically-operated switch to thereby allow power conversion for changing the voltage of the direct current power supply. At this time, desired output current with no improper current included therein can be outputted as a pulse output of such a type that it rises and falls sharply at a high speed by a reverse-current blocking diode provided to block a capacitor from being discharged.

According to a second aspect of this invention, there is further provided a pulse electric power unit comprising a direct current power converter capable of boosting or unboosting and having a regenerative function, the direct current power converter including circuit components which comprise an electronically-operated switch, a first reactor and a first diode, the electronically-operated switch, the first reactor and the first diode being serially connected in turn from a high-potential side to a low-potential side with respect to the direct current power supply; a serially-connected structure composed of a capacitor and a second diode which are connected in parallel with a serially-connected structure composed of the first reactor and the first diode; and a serially-connected structure composed of a second reactor and a load which are connected in parallel with the second diode. The output current from the direct current power converter is controlled at intervals by means of the electronically-operated switch to thereby allow power conversion for boosting or unboosting the voltage of the direct current power supply so as to be the same polarity as that in the voltage of the direct current power supply. At this time, desired output current with no improper current included therein can be outputted as a pulse output of such a type that it rises and falls sharply at a high speed by a reverse-current blocking diode.

According to a third aspect of this invention, there is still further provided a pulse electric power unit comprising with a direct current power converter capable of boosting and having a regenerative function, the direct current power converter including circuit components which comprise an electronically-operated switch, a first reactor and a first diode, the electronically-operated switch, the first reactor and the first diode being serially connected in turn from a high-potential side to a low-potential side with respect to the direct current power supply; a serially-connected structure composed of a capacitor and a second diode which are connected in parallel with the electronically-operated switch; and a serially-connected structure composed of a second reactor and a load which are connected in parallel with a serially-connected structure composed of the capacitor, the first reactor and the first diode. The output current from the direct current power converter is controlled at intervals by means of the electronically-operated switch to thereby allow power conversion for boosting the voltage of the direct current power supply so as to be the same polarity as that in the voltage of the direct current power supply. At this time, desired output current with no improper current included therein can be outputted as a pulse output of such a type that it rises and falls sharply at a high speed by a reverse-current blocking diode.

The above and other objects, features and advantages of the present invention will become apparent from the following detailed description and the appended claims, taken in conjunction with the accompanying drawings in which preferred embodiments of the present invention are shown by way of illustrative example.

BRIEF DESCRIPTION OF THE DRAWINGS

FIG. 3 is a timing chart for describing the operation of the control circuit of FIG. 2 for pulse-operating the Ćuk converter, the chart showing signals employed in respective parts of the control circuit;

FIG. 4 is a timing chart for comparing the operation of the pulse electric power unit employing the conventional Ćuk converter with that of a pulse electric power unit according to one embodiment of this invention to thereby describe the comparison result, the chart showing signals employed in individual parts of both power units;

FIG. 5 is a timing chart for describing the operations effected when the pulse electric power unit of FIG. 1 is practically actuated, the chart showing signals employed in individual parts of the pulse electric power unit;

FIG. 6 is a circuit diagram showing the structure of a pulse electric power unit according to a first embodiment of this invention;

DETAILED DESCRIPTION OF THE PREFERRED EMBODIMENTS

Preferred embodiments of this invention will hereinafter be described with reference to the accompanying drawings. FIG. 6 is a circuit diagram showing the structure of a pulse electric power unit according to one embodiment of this invention. In the same drawing, there are shown a direct current power supply PS1, reactors L1, L2, a capacitor C1, diodes D1, D2, a transistor TR1, a gate drive circuit GA1, and a load RL. According to the present embodiment of this invention, the diode D1 as a reverse-current blocking diode is connected between the direct current power supply PS1 and the reactor L1 employed in a Cuk converter. This diode D1 is connected to the positive (+) polarity of the direct current power supply PS1. However, it may be connected to the negative (−) polarity. At this case, this negative connection can also bring about the same effect as that obtained in the case of the positive connection.

Figure 1:
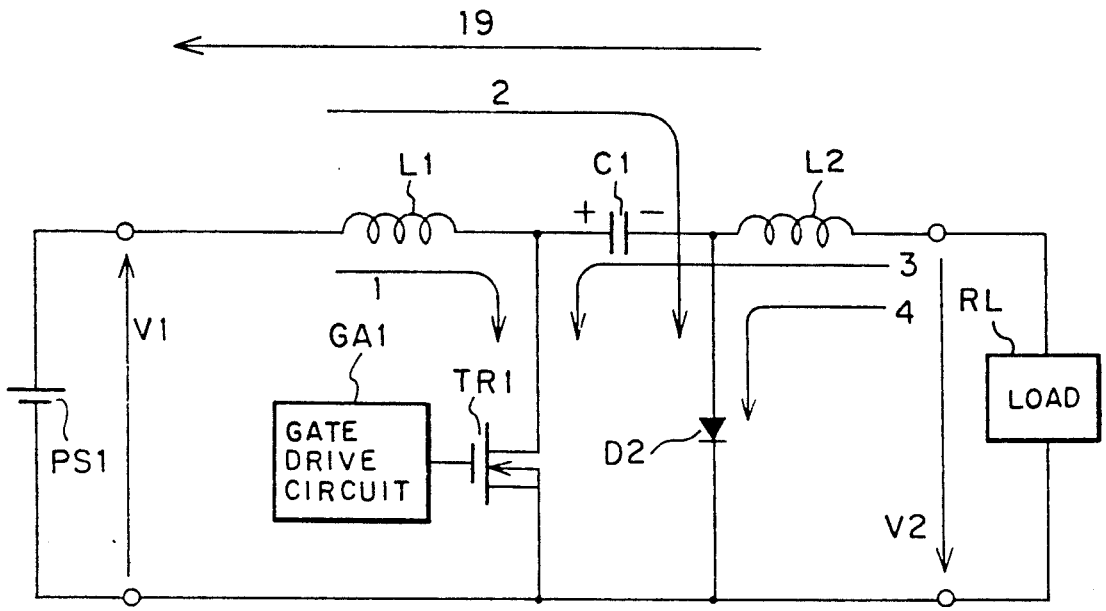
FIG. 1 is a circuit diagram showing the structure of a pulse electric power unit of such a type that a Ćuk converter employed as a conventional direct current power converter is pulse-operated to output pulse current.

The operation of the pulse electric power unit shown in FIG. 6 according to the present embodiment of this invention is substantially identical to that effected in a conventional pulse electric power unit depicted in FIG. 1. On the other hand, when a pulse signal 24 generated from a pulse signal generator 7 is in an OFF state, i.e., a non-supplied state, current 19 discharged from the capacitor C1, which is indicated by the arrow (broken line) of FIG. 6 is blocked from flowing by the diode D1. Thus, no voltage stored in the capacitor C1 is discharged and hence its voltage is being kept at a voltage 22 of the capacitor C1 at the time of switching of the transistor TR1 as in a voltage 21 of the capacitor C1 shown in FIG. 4(e). In addition, improper current 20 outputted from the transistor TR1, which is shown in FIG. 4(b) does not occur when the current pulse falls. When the pulse signal 24 is in an ON state, i.e., a supplied state, the voltage 22 of the capacitor C1 becomes equal to the voltage 21. Thus, the time T2 required for output current 23 which flows though the load RL to rise from the bottom is sharply changed at a high speed.

Figure 7A:
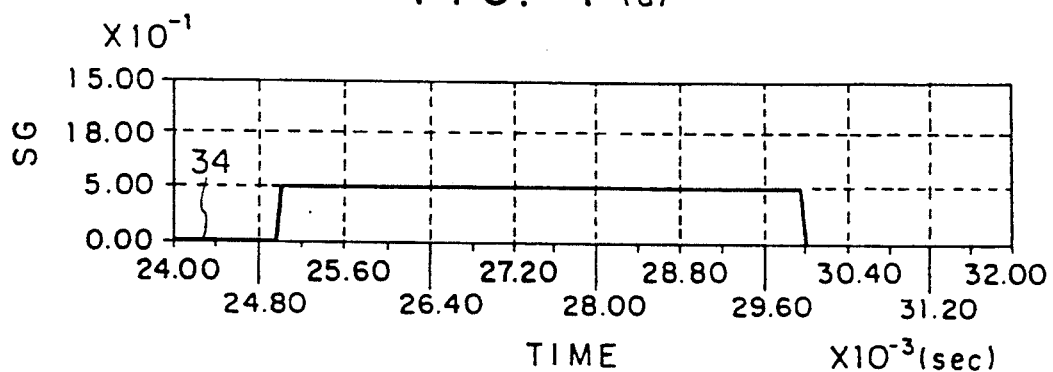
FIG. 7 is a timing chart for describing the operations effected when the pulse electric power unit of FIG. 6 is practically actuated, the chart showing signals used in respective parts of the pulse electric power unit.
Figure 7B:
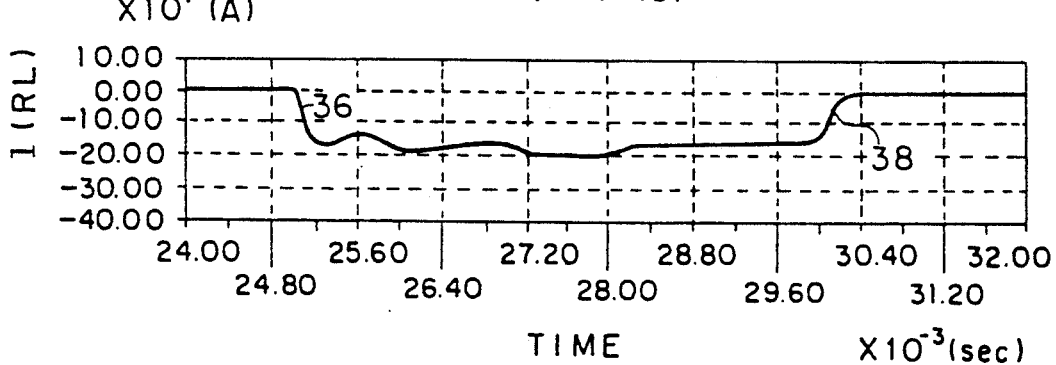
Figure 7C:
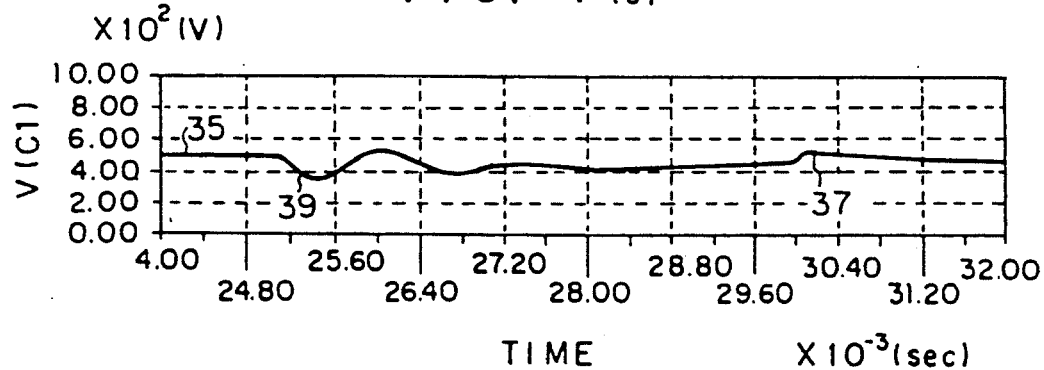

FIG. 7 is a timing chart for describing the operations effected when the pulse electric power unit shown in FIG. 6 is practically actuated, the chart showing signals employed in respective parts of the pulse electric power unit. In the same drawing, designated at numeral 34 is a pulse signal. Numerals 35, 37 and 39 designate voltages stored in the capacitor C1 and numerals 36, 38 indicate currents which flow into the load RL. At this case, a voltage 35 necessary to charge the capacitor C1 with respect to the pulse signal 34 shown in FIG. 7(a) is shown in FIG. 7(c) under the condition of operation that a frequency of a signal 12 from a triangular-wave signal generator 5 is 20 KHz, the inductance of each of the reactors L1, L2 is 100 μH, the capacitance of the capacitor C1 is 100 μF, the output voltage of the direct current power supply PS1 is 230 V, the resistance of the load RL is 1.5 Ω, and the electric conductivity of the transistor TR1 is 50%. A voltage 39 which varies upon its rise exists. However, it becomes a substantially-constant voltage ranging from 450 V to 500 V. On the other hand, a voltage 37 of the capacitor C1 which appears at the time of its fall is a voltage substantially twice the voltage of the direct current power supply PS1 as shown in FIG. 7(c). At this time, no improper current flows through the load RL as in output current 38 shown in FIG. 7(b) which flows through the load RL. The time required for the current which flows through the load RL to rise is about 0.1 msec., whereas the time required for the current which flows through the load RL to fall is about 0.2 msec. As a consequence, the present embodiment can bring about a high-speed response characteristic of several times that obtained in the above-described conventional example.

Figure 8:
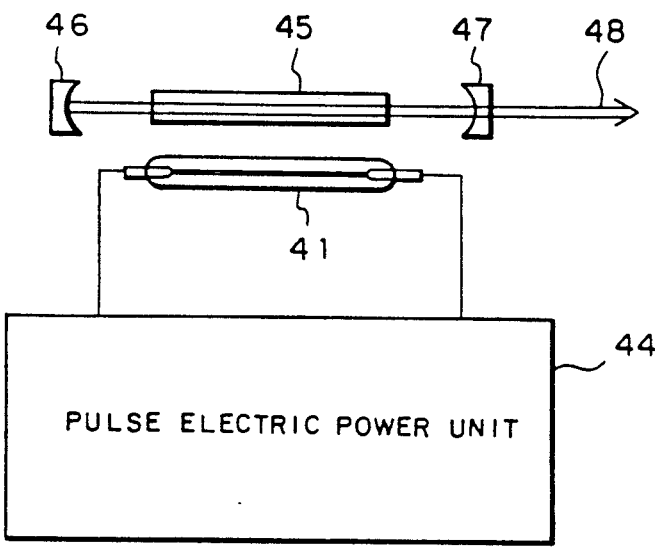
FIG. 8 is a schematic diagram showing the structure of a YAG laser oscillator to which the pulse electric power unit according to the first embodiment of this invention is applied.

FIG. 8 is a schematic diagram showing the structure of a YAG laser oscillator to which a pulse electric power unit according to a first embodiment of this invention is applied. In the same drawing, there are shown an arc lamp 41, a pulse electric power unit 44 used to illuminate the arc lamp 41 to be excited by the YAG laser oscillator, i.e. used for the YAG laser excitation, a YAG rod 45 used as a YAG laser medium, a full reflecting mirror 46, a partial transmission mirror 47, and a laser light or beam 48.

In the YAG laser oscillator shown in FIG. 8, the arc lamp 41 is illuminated by the pulse electric power unit 44 used to illuminate the arc lamp used for the YAG laser excitation. Light from the arc lamp 41 is focused on the YAG rod 45 as the YAG laser medium to thereby produce laser excitation. Thus, the full reflecting mirror 46 and the partial transmission mirror 47 can output the laser beam 48 to the outside. At this case, when the power discharged from the arc lamp 41 is set to a high value, the power of the laser beam 48 also becomes greater in proportional to the increased power value. It is also feasible to control the power of the laser beam 48 at a high speed by controlling the power discharged from the arc lamp 41 at high-speed response.

Figure 9:
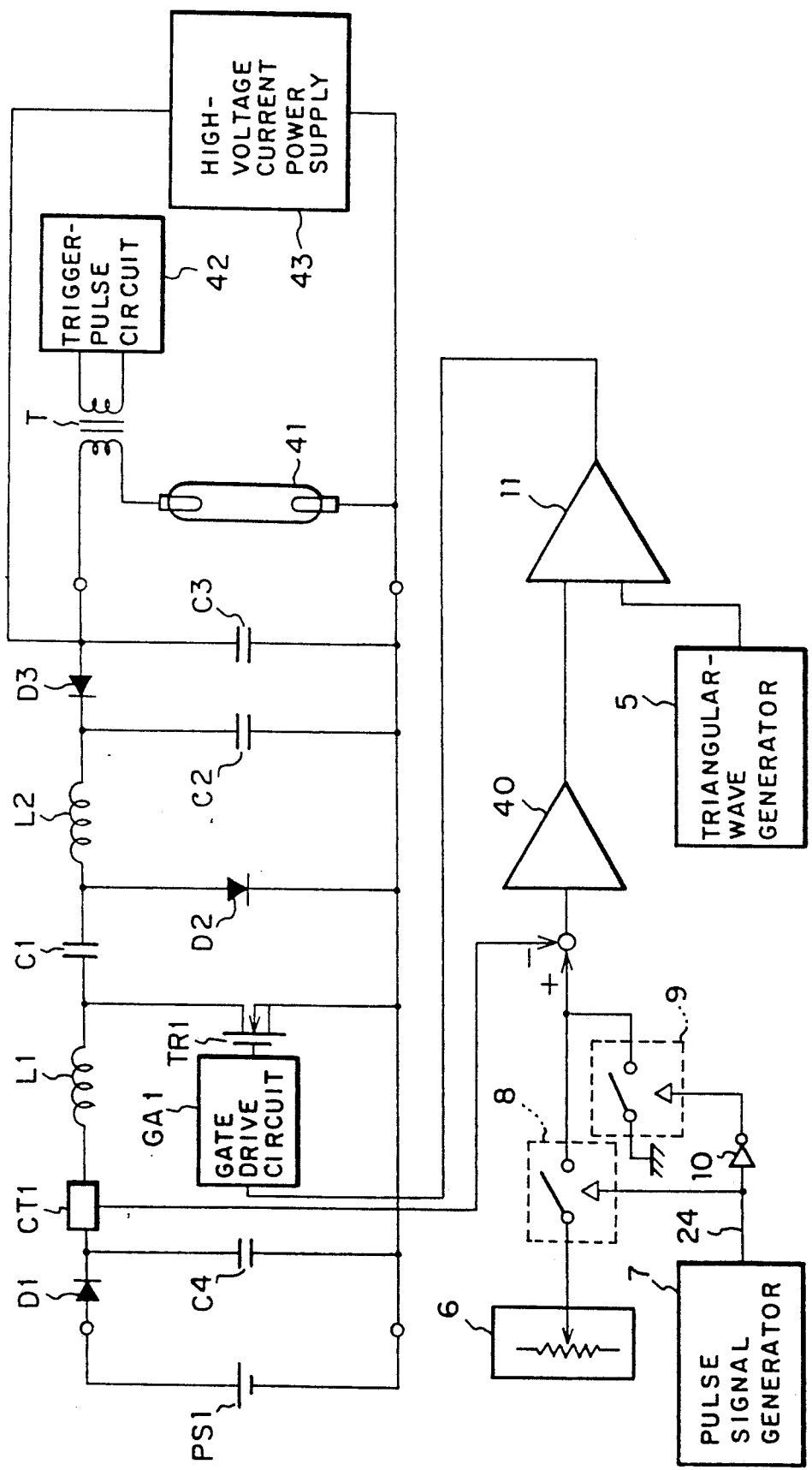
FIG. 9 is a circuit diagram showing one example of the pulse electric power unit of FIG. 8 used to illuminate an arc lamp used for the YAG laser excitation.

FIG. 9 is a circuit diagram showing one example of the pulse electric power unit of FIG. 8 used to illuminate an arc lamp for the YAG laser excitation. The same reference numerals as those in FIGS. 6, 8 and 2 designate similar parts and their detailed description will therefore be omitted. In the same drawing, there are shown an amplifier 40, a trigger-pulse circuit 42, a high-voltage direct current power supply 43, capacitors C2, C3, C4, a diode D3, a transformer T, and a current detector CT1.

The operation of the pulse electric power unit shown in FIG. 9 used to illuminate the arc lamp for the YAG laser-excitation is substantially similar to that effected in the pulse electric power unit shown in FIG. 6. However, the capacitor C4 is a relatively small-capacity type capacitor used to avoid occurrence of a high voltage in the diode D1. The operation of the Cuk converter is not affected by the capacitor C4. Each of the reactors L1, L2 may be a substantially similar inductance and is useful in improving the ripple of the output current by magnetically connecting both reactors to each other. The capacitor C2 is a relatively small-capacity type capacitor used to prevent a high voltage from occurring in the diode D3. The capacitor C3 is also a relatively small-capacity type capacitor used to avoid addition of a high voltage of a high frequency generated from the trigger-pulse circuit 42 to the diode D3. Thus, the operation of the Cuk converter is not influenced by the capacitors C2 and C3. The diode D3 is adapted to avoid a high voltage from the high-voltage direct current power supply 43. The trigger-pulse circuit 42 is connected between an output of the pulse electric power unit used to illuminate the arc lamp for the YAG laser excitation and a cathode of the arc lamp 41 through the transformer T. This circuit 42 operates when an unilluminated arc lamp 41 is turned on.

Once the arc lamp 41 lights on, the high-voltage direct current power supply 43 serves to keep the arc lamp 41 discharging with slight current. The current used to keep the arc lamp 41 discharging will generally be referred to as "Shimmer current". In order to control the electric power discharged by the arc lamp 41, the current detector CT1 detects current inputted from the Cuk converter. Also by providing a command control unit 6, a pulse signal generator 7, switches 8, 9 operative to open or close depending on supply/non-supply of a pulse signal 24 from the pulse signal generator 7, an amplifier 40 for amplifying the difference between two signals to be inputted thereto, a triangular-wave signal generator 5 and a comparator 11, and by controlling the conducting angle of the transistor TR1 as a semiconductor switching device employed in the Cuk converter, the output voltage from the direct current power supply PS1 is power-converted to illuminate or turn on the arc lamp 41 used for the YAG laser excitation.

In such a power-conversion system, if the output voltage of the direct current power supply PS1 is constant, the power to be discharged from the arc lamp 41 is determined by the current inputted from the Cuk converter and is proportional to a value set by the command control unit 6. In particular, since a discharge voltage of the arc lamp 41 varies depending on the current and variations or fluctuations in the voltage of the arc lamp 41 exist, the power to be discharged from the arc lamp 41 can be controlled regardless of such variations and fluctuations as referred to above. This exhibits that the power of the laser beam 48 is proportional to the value set by the command control unit 6. The YAG laser oscillator is therefore fit for the purpose of controlling the power of the laser beam 48. As described above, the Cuk converter features that the stability of discharging or turning on of the arc lamp 41 made under the control of slight current becomes quite well because the ripple of the output current can be reduced without making use of a large-capacity type capacitor C1 or large-inductance type reactors L1, L2 so as to be fit for the power of the laser beam 48.

Figure 10:
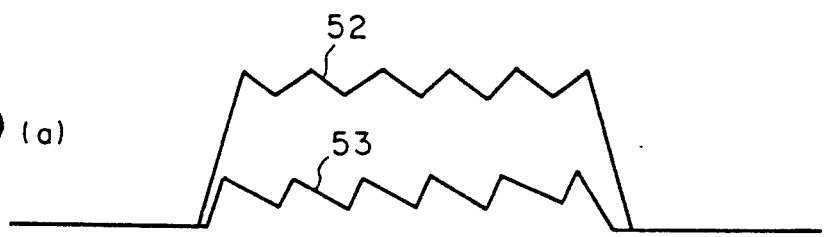
FIG. 10 is a timing chart for describing the operation of the pulse electric power unit of FIG. 9 used to illuminate the arc lamp used for the YAG laser excitation, the chart showing signals employed in respective parts of the pulse electric power unit.
Figure 10:
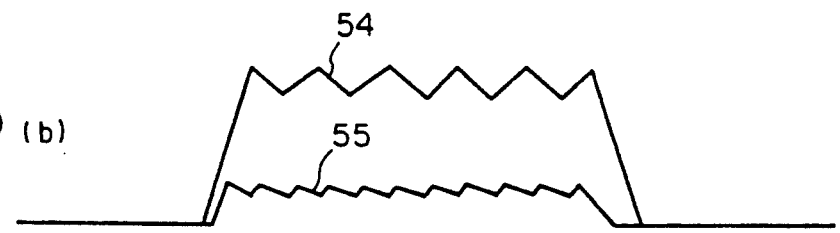
Figure 10:
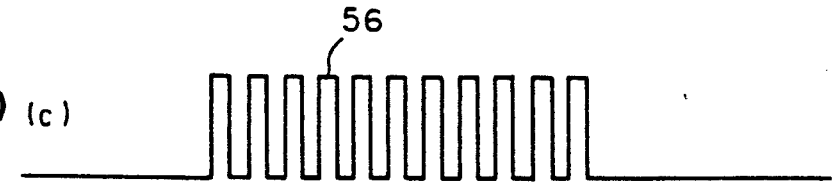

FIG. 10 is a timing chart for describing the operation of the pulse electric power unit of FIG. 9 used to turn on the arc lamp used for the YAG laser excitation, the chart showing signals employed in respective parts of the pulse electric power unit. In the same drawing, there are shown output currents 52 to 55 from a pulse electric power unit 44 used to illuminate the arc lamp for the YAG laser excitation, and a switching signal 56 used to turn on or off the transistor TR1. FIG. 10(a) shows the output currents from the frequency-control-free pulse electric power unit used to turn on the arc lamp for the YAG laser excitation. The large output current 52 and small output current 53 are substantially equivalent in ripple to each other. In the case of the substantially-small output current 53, a phenomenon that no current flows through the arc lamp 41 owing to occurrence of the valley-point in the ripple is developed. When no current flows through the arc lamp 41, the output voltage of the Cuk converter rises extraordinarily, so that the transistor TR1 and the diode D2 ar destroyed. Thus, the pulse electric power unit used to turn on the arm lamp for the YAG laser excitation would have a limited control range.

FIG. 10(b) shows the difference in ripple between a large output current 54 and a small output current 55 in the currents outputted from the frequency-controlled pulse electric power unit 44 used to illuminate the arc lamp for the YAG laser excitation. As shown in FIG. 10(c), the ripple of the small output current 55 can substantially be reduced by making high a frequency of the switching signal 56 used to turn on or off the transistor TR1.

Figure 11:
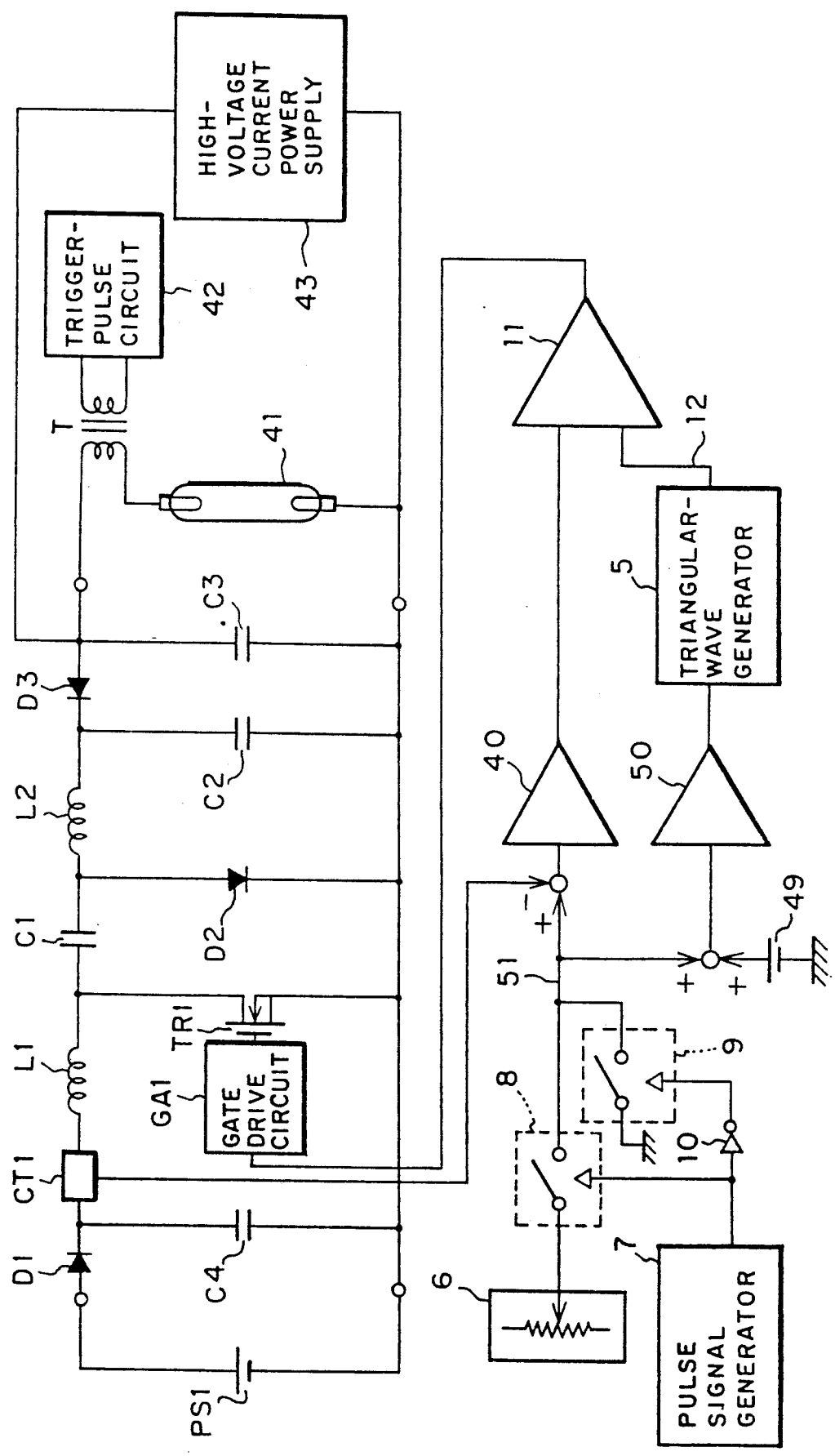
FIG. 11 is a circuit diagram showing another example of the pulse electric power unit of FIG. 8 used to illuminate the arc lamp for the YAG laser excitation.

FIG. 11 is a circuit diagram showing another example of the pulse electric power unit of FIG. 8 used to illuminate an arc lamp for the YAG laser excitation. The same reference numerals as those in FIG. 9 designate similar parts and their description will therefore be omitted. In the same drawing, designated at numeral 49 is a reference voltage source for providing a reference voltage. Designated at numeral 50 is an amplifier and numeral 51 indicates a pulse command value which has been pulsated by means of switches 8 and 9. The pulse electric power unit 44 shown in FIG. 11 used to turn on the arc lamp for the YAG laser excitation is different from the pulse electric power unit 44 shown in FIG. 9 in that an amplifier 50 amplifies the sum of the pulse command value 51 which has been pulsated by means of the switches 8, 9 and the reference voltage from the reference voltage source 49, and an oscillating frequency of a signal 12 generated by a triangular-wave signal generator 5 of a type wherein the oscillating frequency can be changed depending on an input voltage is changed depending upon the pulse command value 51.

Figure 12:
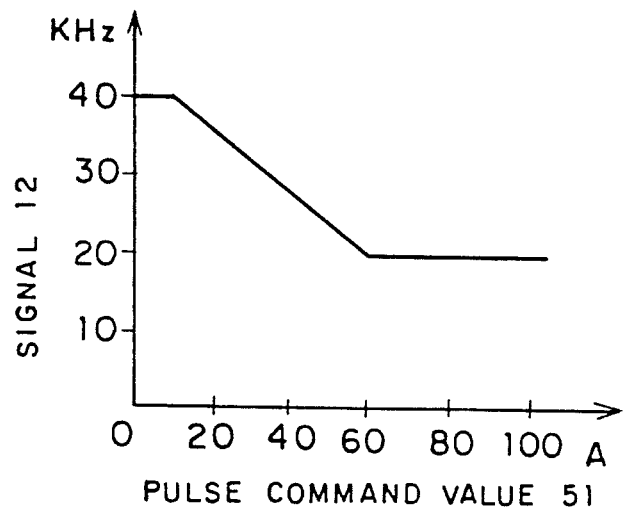
FIG. 12 is a characteristic graph for describing the operation of the pulse electric power unit of FIG. 11 used to illuminate the arc lamp for the YAG laser excitation.

FIG. 12 is a graph for describing the operation of the pulse electric power unit shown in FIG. 11 used to illuminate the arc lamp for the YAG laser excitation. FIG. 12 is also a characteristic graph for describing the relationship between the pulse command value 51 and the signal 1 from the triangular-wave signal generator 5 shown in FIG. 11. As represented by the graph of FIG. 12, the oscillating frequency of the signal 12 produced by the triangular-wave signal generator 5 is controlled by the pulse command value 51 so as to be low as circuit current makes greater. When the switching operation of the transistor TR1 is made, the circuit current flows in succession where the current which flows through the reactors L1, L2 is greater, while when the current-flowing-through-the reactors is small or low, the circuit current is put under a current intermittent mode. Thus, such control as referred to above prevents an overvoltage from occurring in the transistor TR1 and the diode D2 and reduces an increase in the ripple of the output current. This also reduces a switching loss in the transistor TR1, which occurs in the case of a large current, and also makes an improvement in the power conversion efficiency of the pulse electric power unit 44 used to illuminate the arc lamp for the YAG laser excitation.

Figure 13:
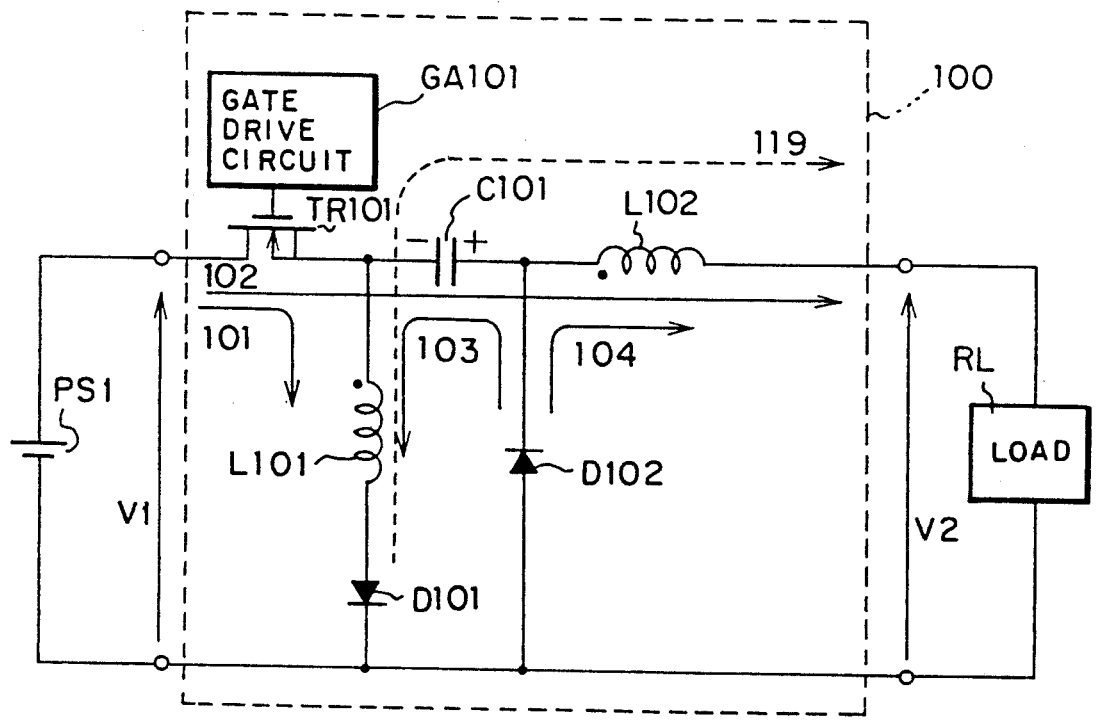
FIG. 13 is a circuit diagram showing the structure of a pulse electric power unit according to a second embodiment of this invention.

FIG. 13 is circuit diagram showing the structure of a pulse electric power unit according to a second embodiment of this invention. In the same drawing, there are shown a direct current power supply PS1, reactors L101, L102, a capacitor C101, diodes D101, D102, a transistor TR101, a gate drive circuit GA101, a load RL, a pulse electric power unit 100, currents 101 through 104, and discharge current 119 from the capacitor C101.

The operation of the pulse electric power unit 100 shown in FIG. 13 according to the second embodiment of this invention will now be described. When the transistor TR101 connected to the direct current power supply PS1 and whose conductivity is controlled by the gate drive circuit GA101 is turned on, the current 101 indicated by the arrow flows into the reactor 101. Further, the current 102 indicated by the arrow flows into the capacitor 101, the reactor L102 and the load RL. On the other hand, when the transistor TR101 is turned off, circuit current changes from the current 101 indicated by the arrow to current 103 indicated by the arrow. The current 103 serves to charge the capacitor C101 and flows through the diodes D101 and D102.

When the transistor TR101 is turned on again, the current 101 further increases. The current 102 flows into the load RL through the transistor TR101, the capacitor C101, the reactor L102. At this case, the currents 102, 104 flow into the load RL in succession, so that the power conversion is made.

Further, when the transistor TR101 is turned off, the circuit current changes from the increased current 101 to the current 103. The current 103 serves to charge the capacitor C101 up to the level of the polarity shown in FIG. 13. Then, the current 102 which flows through the reactor L102 is changed to the current 104, which in turn flows into the load RL in succession. The pulse electric power unit 100 is operated as described above, so that the direct-current power conversion is effected.

Figure 14:
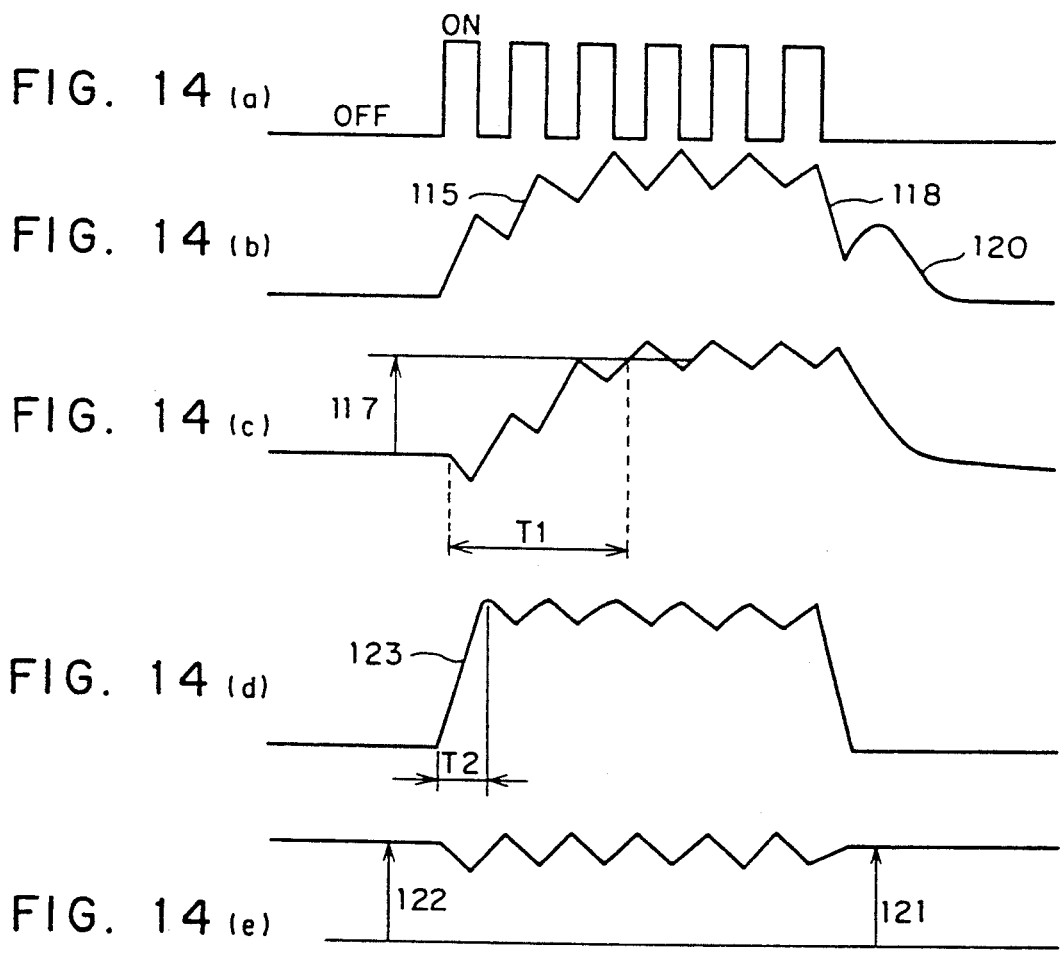
FIG. 14 is a timing chart for describing the operation of the pulse electric power unit shown in FIG. 13, the chart showing signals employed in respective parts of the pulse electric power unit.

FIG. 14 is a timing chart for describing the operation of the pulse electric power unit shown in FIG. 13, the chart showing signal employed in respective parts of the pulse electric power unit. In the same drawing, there are shown output currents 115, 118, 120 from the transistor TR101, voltages 117, 121, 122 each to be stored in the capacitor C101, and output current 123 at the load RL.

Figure 2:
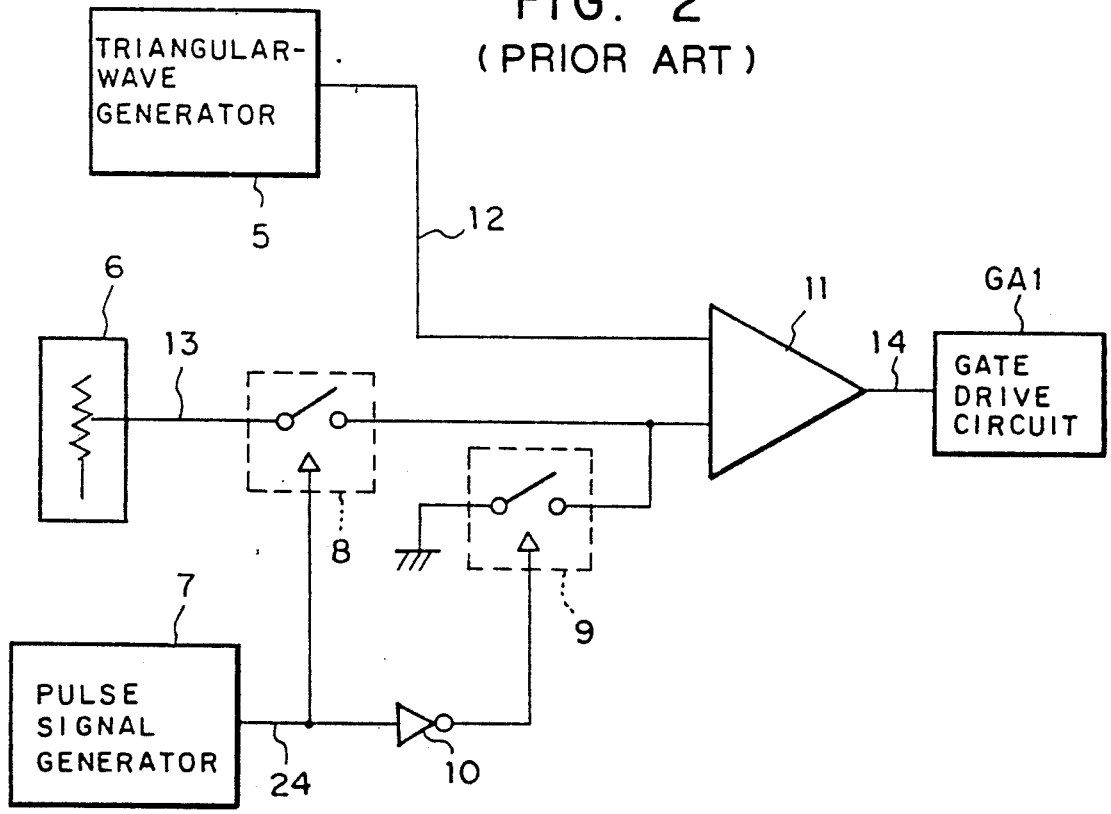
FIG. 2 is a block diagram depicting the structure of a control circuit for pulse-operating the Ćuk converter.

14(a) shows an operation characteristic obtained when the transistor TR101 is turned on and off. First of all, a description will be made of the operation of the pulse electric power unit in a case where the diode D101 shown in FIG. 13 does not exist. When the pulse signal generator 7 shown in FIG. 2 is turned on to output an ON signal (the pulse signal 24) therefrom, the switching operation of the transistor TR101 is made in response to the signal shown in FIG. 14(a). As a consequence, the output current 115 from the transistor TR101 is increased as illustrated in FIG. 14(b). Further, a voltage stored in the capacitor C101 rises up to the voltage 117 as depicted in FIG. 14(c). Thus, the time required to charge the capacitor C101 is equal to the time T1 required for the output current 115 of the transistor TR101 to rise. The transistor TR101 should have the switching operations of 5 to 20 times in order to charge the capacitor C101. Therefore, the rise time T1 of the output current 115 becomes slow or long.

On the other hand, when the pulse signal generator 7 is turned off to output an OFF signal therefrom, the switching operation of the transistor TR101 is stopped in response to the signal shown in FIG. 14(a). As a result, the output current 118 of the transistor TR101 decreases as shown in FIG. 14(b). With this operation, a voltage stored in the capacitor C101 is reduced to a zero voltage from the voltage 117 as illustrated in FIG. 14(c). This results from the fact that the switching operation of the transistor TR101 is stopped and at the same time, discharge current 119 indicated by the arrow (broken line) of FIG. 13 flows, so that the voltage of the capacitor C101 is discharged. The irregular or improper current 120 is produced as shown in FIG. 14(b) because the discharge current 119 flows through the load RL. Such improper output current 120 shows an output-current waveform different from that of the signal 13 outputted from the command control unit 6.

However, if the diode D101 is inserted into the circuit shown in FIG. 13, the above discharge current 119 serving as reverse current of the diode D101 is prevented from flowing owing to the provision of the diode D101. Thus, the voltage stored in the capacitor C101 is no longer discharged and hence the voltage 122 of the capacitor C101 at the time that the switching operation of the transistor TR101 is effected remains unchanged as in the voltage 121 of the capacitor C101 shown in FIG. 14(e). Further, such improper output current 120 of the transistor TR101 as shown in FIG. 14(b) is no longer developed at the time of its fall. On the other hand, when the pulse signal 24 is in an ON state, i.e., a supplied state, the voltage 122 of the capacitor C101 shown in FIG. 14(e) is equal to the voltage 121. Thus, the time T2 required for the output current 123 of the load RL shown in FIG. 14(d) to rise changes sharply at a high speed.

Since the pulse electric power unit 100 shown in FIG. 13 uses the output voltage of the same polarity as that in the direct current power supply PS1 contrary to the fact that the pulse electric power unit employing the conventional Ĉuk converter utilizes the output voltage of the polarity opposite to that in the direct current power supply PS1, the pulse electric power unit 100 serving as the direct current power converter is superb as compared with the conventional pulse electric power unit. Further, the pulse electric power unit 100 shown in FIG. 13 permits both an increase and decrease in the voltage of the first direct current power supply PS1 in a manner similar to the conventional pulse electric power unit employing the Ĉuk converter. Furthermore, the pulse electric power unit 100 can also reduce the ripple of the output voltage by magnetically connecting the reactors L101 and L102 to each other, thereby making it possible to obtain a superb pulse electric power unit as compared with the conventional electric power unit.

Figure 15:
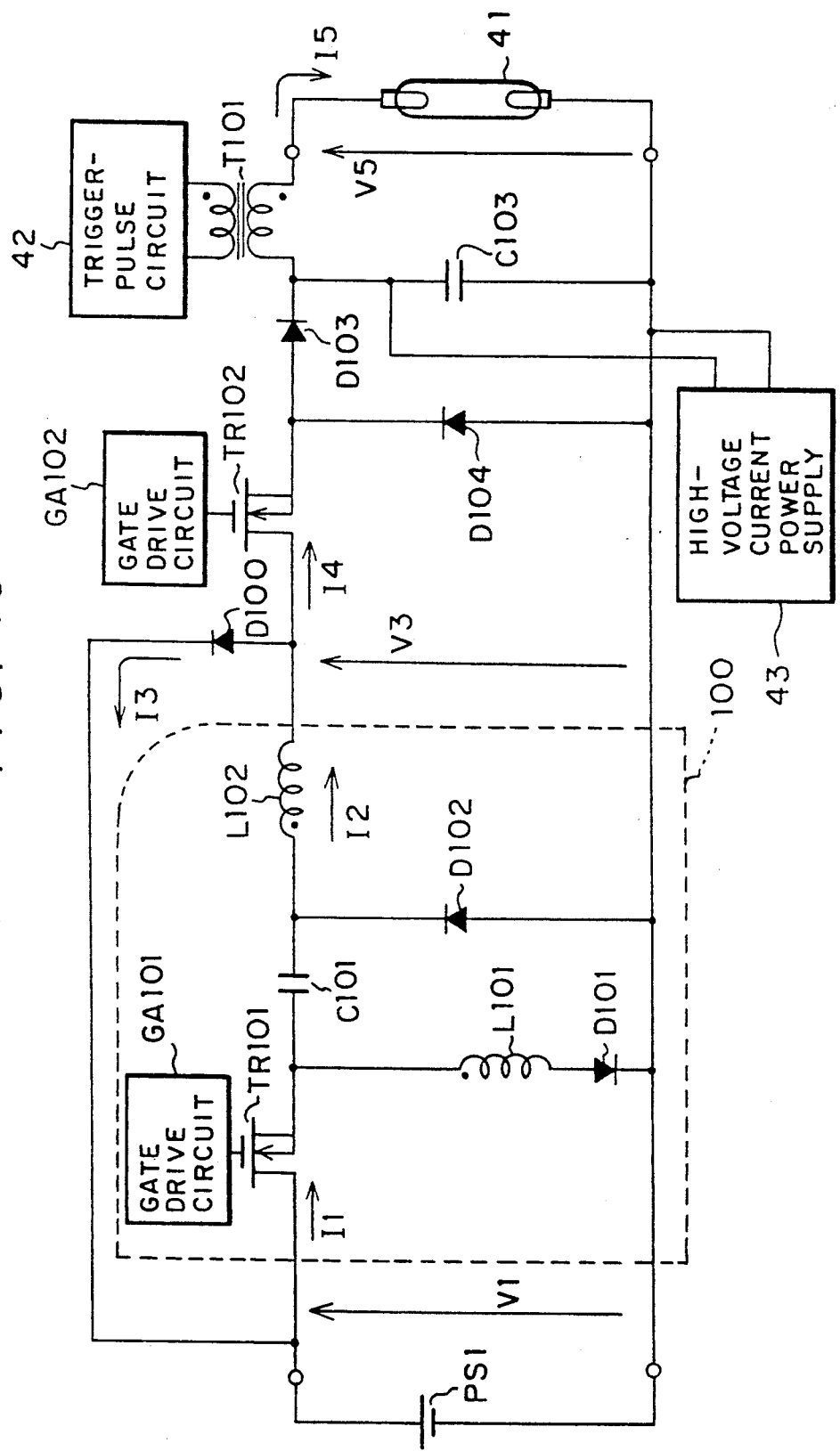
FIG. 15 is a circuit diagram showing a further example of a pulse electric power unit as an alternative to that in FIG. 13, which is used to illuminate an arc lamp for the YAG laser excitation.

FIG. 15 is a circuit diagram showing a further example of a pulse electric power unit as an alternative to that in FIG. 13, which is used to illuminate an arc lamp for the YAG laser excitation. The same reference numerals as those in FIGS. 9 and 13 designate similar parts and their description will therefore be omitted. In the same drawing, there are shown a capacitor C103, diodes D100, D103, D104, a transistor TR102, a transformer T101, and a gate drive circuit GA102.

FIG. 16 is a timing chart for describing the operation of the pulse electric power unit of FIG. 15 used to illuminate the arc lamp for the YAG laser excitation, the chart showing signals employed in respective parts of the pulse electric power unit. In the same drawing, designated at numerals 144 through 150 are currents.

Figure 16A:
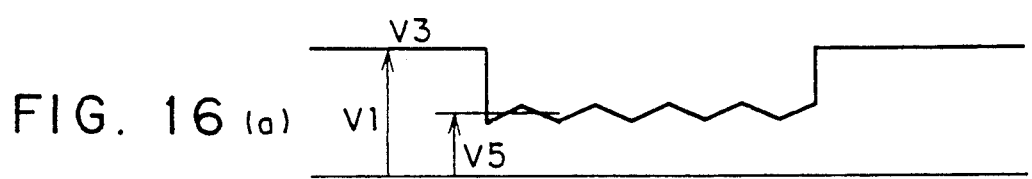
FIG. 16 is a timing chart for describing the operation of the pulse electric power unit of FIG. 15 used to illuminate the arc lamp for the YAG laser excitation, the chart showing signals employed in respective parts of the pulse electric power unit.

A description will now be made of the operation of the pulse electric power unit of FIG. 15 used to illuminate the arc lamp for the YAG laser excitation. As has already been described from the operation of the pulse electric power unit 100 shown in FIG. 13, current I3 shown in FIG. 15 is regeneratively fed back in the form of a power-level to the direct current power supply PS1 by the diode D100 when the transistor TR102 is off-activated subsequently to the power conversion of the voltage of the direct current power supply PS1. At this case, a voltage V1 of the direct current power supply PS1 becomes equal to a voltage V3 obtained after its power conversion has been made. The transistor TR101 effects its switching operation such that current I4 becomes the peak current IL of the arc lamp 41, at which time the current I3 is formed as shown in FIG. 16(c). A high voltage (which generally ranges from 800 V to 1500 V) is applied across the arc lamp 41 by the high-voltage direct current power supply 43 and a high-voltage pulse (which is generally 20 KV whose pulse width is 1 μs) is applied to the transformer T101 by the trigger-pulse circuit 42, thereby causing the discharge of the arc lamp 41 to be initiated.

When the discharge of the arc lamp 41 is initiated, the arc lamp 41 is always supplied with slight current based on the output current determined by the high-voltage direct current power supply 43. This slight current is generally called "Shimmer current". This current corresponds to the current 144 shown in FIG. 16(e). The capacitor C103 is a relatively small-capacity type capacitor and serves to prevent the withstand voltage of the diode D103 from being destroyed by a trigger pulse. The capacitor C103 is used to prevent a high voltage supplied from the high-voltage direct current power supply 43 from flowing into the pulse electric power unit 100 when the arc lamp 41 is in a non-illuminated state.

Figure 16B:
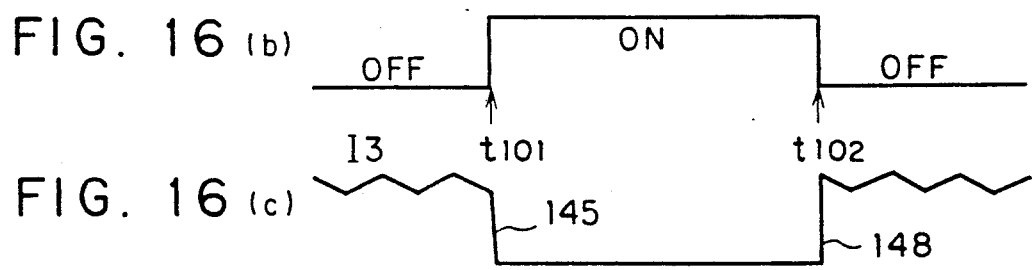
Figure 16C:
Figure 16D:
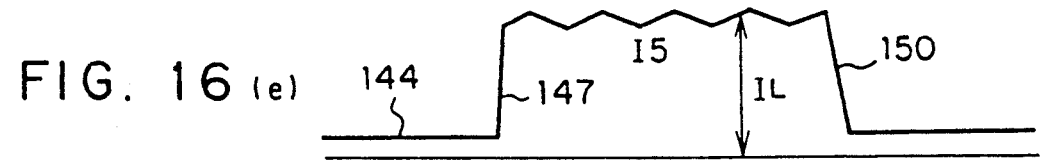

As described above, when the transistor TR102 is turned on at time t101 shown in FIG. 16(b) in a state of the arc lamp 41 being illuminated by the shimmer current, the current I3 which has flowed so far is changed to the current I4 because the discharge voltage V5 of the arc lamp 41 is lower than the voltage V3. This current I4 is represented by the current 145 shown in FIG. 16(c) and the current 146 depicted in FIG. 16(d). Thus, the voltage V3 shown in FIG. 16(a) is changed from the voltage V1 of the direct current power supply PS1 to the discharge voltage V5 of the arc lamp 41. Let's now show the discharge current of the arc lamp 41 in FIG. 16(e). In this case, the current I4 shown in FIG. 16(d) is added to the current 144 as the shimmer current, so that the current I5 of the arc lamp 41 rises up at a high speed as represented by the current 147. The time required for the current I5 to rise at a high speed depends on the inductance of wire connected subsequent to the transistor TR102 and the discharge voltage of the arc lamp 41. Even in a case where the inductance of the wire is on the order of 5 $\mu$H, it is possible to cause the current to rise with high-speed response. On the other hand, when the transistor TR102 is turned off at time t102 shown in FIG. 16(b), the current I4 which has flowed so far is changed to the current I3. This current I3 is represented by the current 148 shown in FIG. 16(c) and the current 149 depicted in FIG. 16(d). Accordingly, the voltage V3 shown in FIG. 16(a) is changed from the discharge voltage V5 of the arc lamp 41 to the voltage V1 of the direct current power supply PS1. Let's now show the discharge current of the arc lamp 41 in FIG. 16(e). In this case, current flows through the diode D104, D103, the transformer T101, and the arc lamp 41. Accordingly, the current I5 which flows through the arc lamp 41 falls down at a high speed as represented by the current 150, and then becomes the current 144 as the shimmer current. The time required for the current I5 to fall depends on the inductance of wire connected subsequent to the transistor TR102 and the discharge voltage of the arc lamp 41. Even in a case where the inductance of the connecting wire is on the order of 5 $\mu$H, it is feasible to cause the current to fall with high speed response.

As described above, it is possible to obtain the high-speed responsible or answerable pulse electric power unit used to illuminate the arc lamp for the YAG laser excitation by providing the regenerative diode D100 and the electronically-switched transistor TR102 to the pulse electric power unit 100 shown in FIG. 13.

Incidentally, a description has been made of the pulse electric power unit used to illuminate the arc lamp for the YAG laser excitation in the above-described embodiment. However, this unit can be applicable to an apparatus employing other discharge systems, i.e., a mercury lamp lighting apparatus, an arc welding set, a stroboscopic apparatus, etc. Even at this case, they can bring about the same effect as that obtained in the above-described embodiment.

Figure 17:
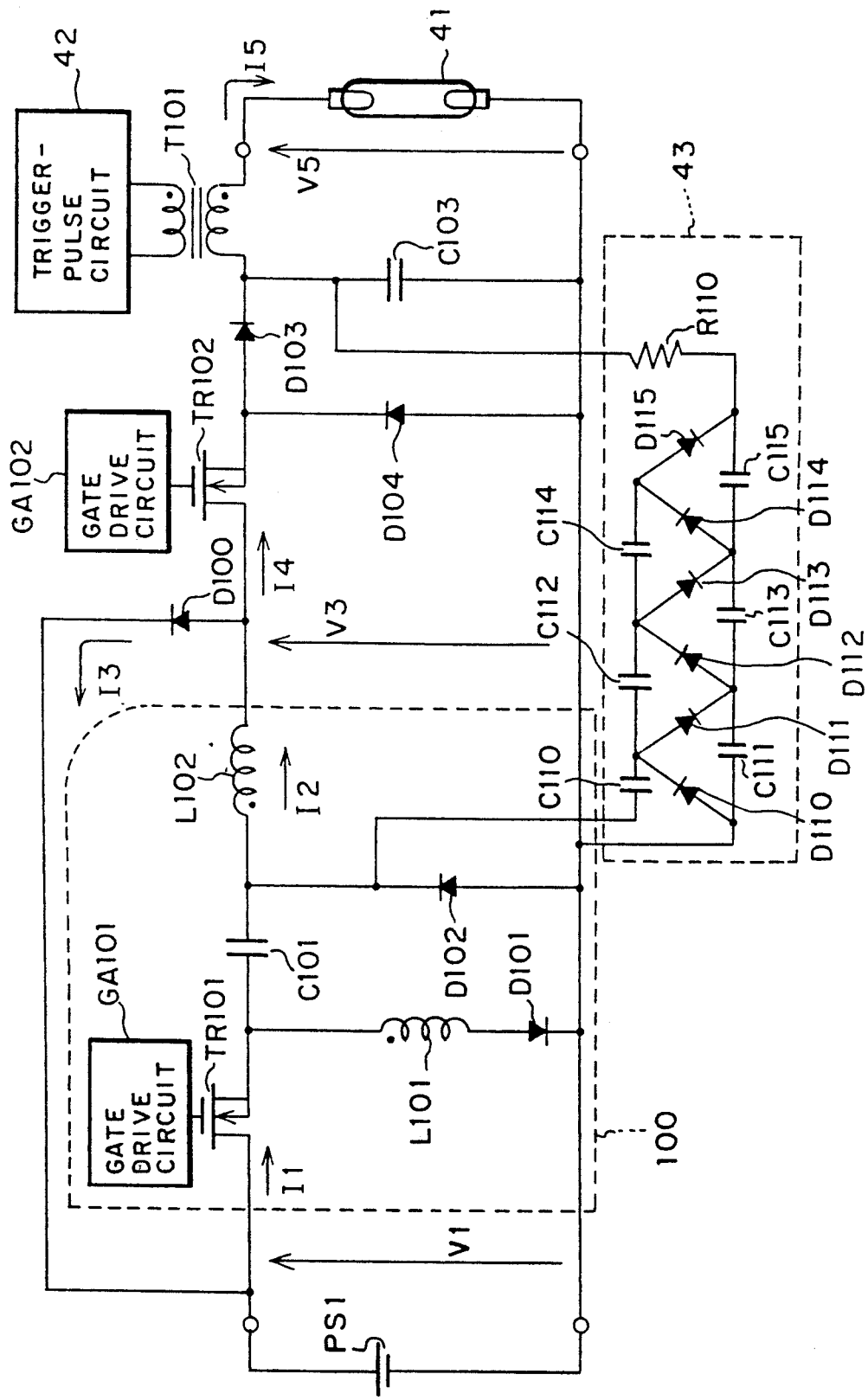
FIG. 17 is a circuit diagram showing the structure of the pulse electric power unit of FIG. 15 which is used to illuminate the arc lamp for the YAG laser excitation and equipped with a high-voltage direct current power supply mentioned by way of illustrative example.

FIG. 17 is a circuit diagram showing the structure of the pulse electric power unit of FIG. 15 equipped with an illustrated high-voltage direct current power supply, which is used to illuminate the arc lamp for the YAG laser excitation. The high-voltage direct current power supply 43 is composed of capacitors C110 through C115, diodes D110 through D115, and a resistor R110. This high-voltage direct current power unit 43 provides a voltage doubler rectifying circuit which carries out voltage doubler rectification using as a power supply a voltage between the anode and the cathode of the diode D102. For example, if a voltage across the diode D102 is about 200 V, the circuit described herein can output a voltage six times that voltage referred to above.

Such a voltage doubler rectifying circuit is referred to as "Cockcroft circuit". This circuit can obtain arbitrary high voltages by increasing the number of stages of the capacitor and diode. The capacitors C110 through C115 may be small capacitance with respect to the diode D102 since the switching operation of the transistor TR10 is effected at a high frequency. In addition, the resistor R110 is used to limit the output current from the voltage doubler rectifying circuit because the discharge voltage V drops when the discharge of the arc lamp 41 takes place. The voltage doubler rectifying circuit employed as the cockcroft circuit can bring about an advantageous effect in that a power supply used for the voltage doubler rectifying circuit is obtained from the diode D102, so that the high-voltage direct current power supply 43 can be achieved in the form of a simpler circuit and at a low cost.

Figure 18:
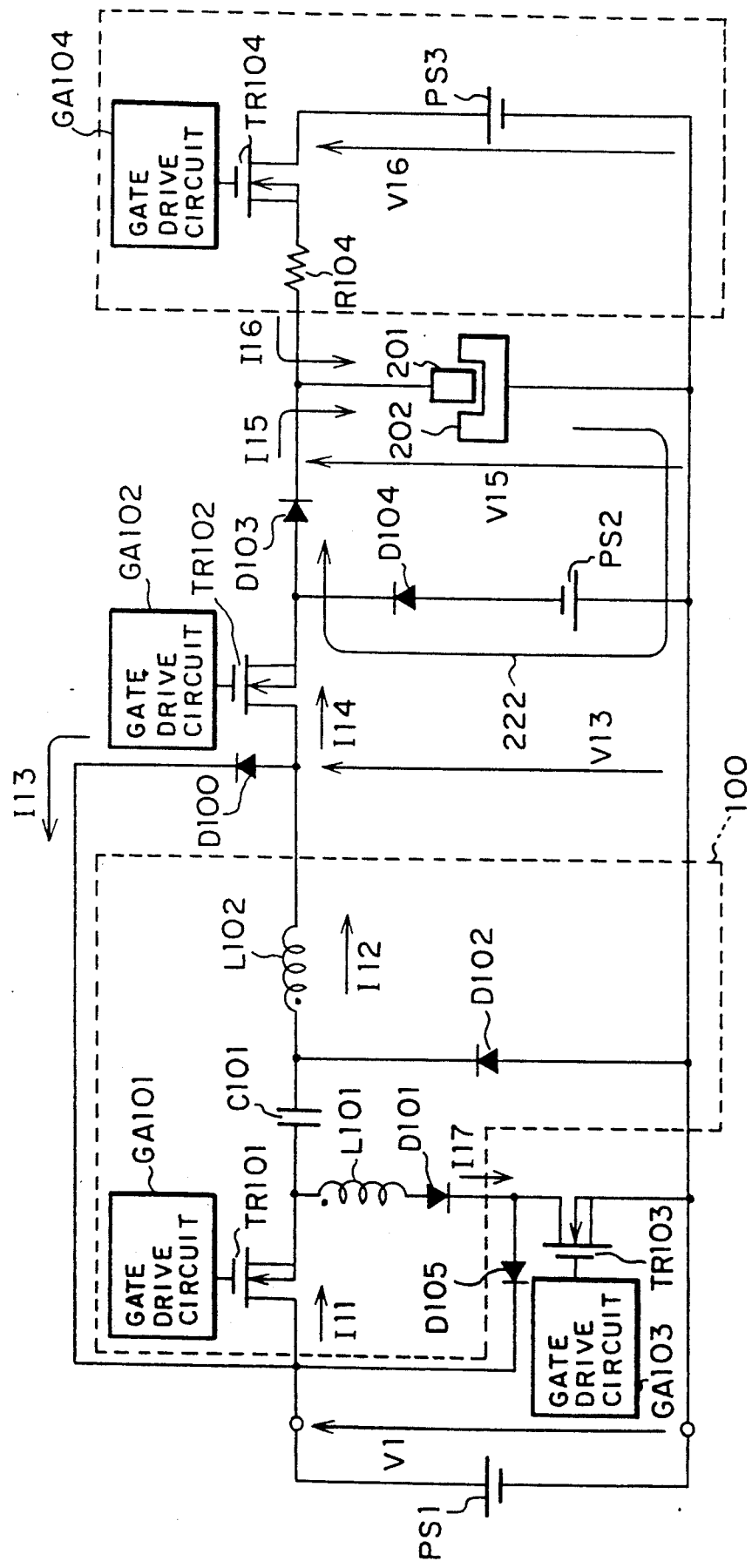
FIG. 18 is a circuit diagram depicting a still further example of a pulse electric power unit for an electric discharge machining as an alternative to the pulse electric power unit shown in FIG. 13.

FIG. 18 is a circuit diagram depicting a still further example of a pulse electric power unit for an electric discharge machining as an alternative to the pulse electric power unit shown in FIG. 13. The same reference numerals as those in FIG. 15 designate similar or corresponding parts, and their detailed description will therefore be omitted. In the same drawing, there are shown a diode D105, transistors TR103, TR104, gate drive circuits GA103, GA104, direct current power supplies PS2, PS3, a resistor R104, an electrode 201, and an object or workpiece 202 to be machined.

Figure 19:
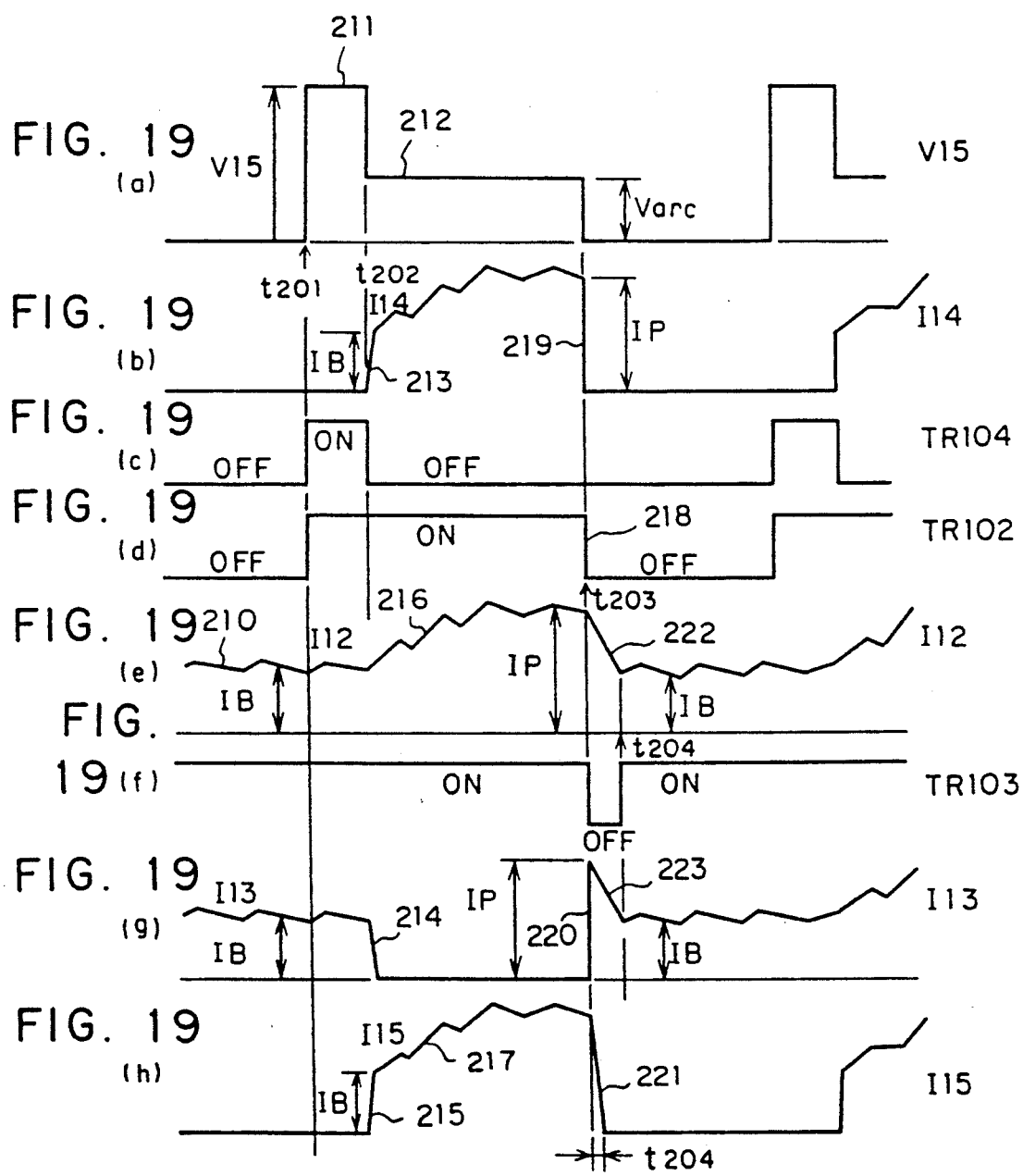
FIG. 19 is a timing chart for describing the operation of the pulse electric power unit of FIG. 18 for the electric discharge machining, the chart showing signals employed in respective parts of the pulse electric power unit.

FIG. 19 is a timing chart for describing the operation of the pulse electric power unit of FIG. 18 used for the electric discharge machining, the chart showing signals employed in respective parts of the pulse electric power unit. In the same drawing, designated at numerals 211, 212 are voltages and designated at numerals 210 and 213 through 223 are currents.

A description will now be made of the operation of the pulse electric power unit shown in FIG. 18 for the electric discharge machining. The transistor TR101 performs a switching operation in such a way that current I12 as the current 210 shown in FIG. 19(e) becomes base current IB. The voltage of the direct current power supply PS3 used for the discharge generation are set to be on the order of 80 V through 350 V. In this case, a voltage V16 of the direct current power supply PS3 is applied between the electrode 201 and the object 202 to be machined through the resistor R104 by means of the transistor TR104 used to cause current to cease at intervals and the gate drive circuit GA104 adapted to control an ON/OFF operation of the transistor TR104.

When the transistors TR104 and TR102 are ON-actuated at time t201 shown in FIG. 19(a) as shown in FIGS. 19(c) and 19(d), a voltage V1 developed between the electrode 201 and the object 202 to be machined increases u p to a voltage V16 of the direct current power supply PS3 as represented by the voltage 211 of FIG. 19(a). On the other hand, when the discharge is developed between the electrode 201 and the object 202 to be machined at time 202 shown in FIG. 19(a), a voltage 212 drops to a discharge voltage Varc. At this time, the transistor TR104 is turned off. Current I14 flowing in the transistor TR102, which has been ON-actuated so far and through which no current has flowed, becomes base current IB as represented by the current 213 shown in FIG. 19(b). Further, current I13 becomes zero as represented by the current 214 shown in FIG. 19(g). Thus, discharge current I15, which flows in the electrode 201 becomes the base current IB as represented by the current 215 illustrated in FIG. 19(h).

The conductivity of the transistor TR101 is enhanced and output current I12 is increased with a predetermined inclination as represented by the current 216 of FIG. 19(e). When the increased current reaches the peak current IP, the output current I12 is controlled to be kept constant. Thus, the discharge current I15 has also the same waveform as that in the current I12 as represented by the current 217.

When the transistor TR102 is turned off at time t203 on a waveshape of the current 218, the current I14 becomes zero as represented by the current 219 of FIG. 19(b), while the current I13 becomes the peak current IP as represented by the current 220 of FIG. 19(g). As represented by the current 221 of FIG. 19(h), the current I15 flows in a loop form through the direct current power supply PS2 connected in the form of the reverse polarity, the diodes D104, D103, the electrode 201, and the object 202 to be machined, like the current 222 shown in FIG. 18. Then, the current I15 is decreased at a high speed at time t204 of FIG. 19(h) which is determined by the inductance of connecting wire, the voltage from the direct current power supply PS2 and the discharge voltage Varc. When the transistors TR102 and TR101 are turned off at the time t203 on the waveform of the current 218 shown in FIG. 19(d) and at the same time the transistor TR103 is OFF-actuated as shown in FIG. 19(f), the current I12, as represented by the current 222 of FIG. 19(e), flows through the diode D102, the reactor L102 and the diode D100 and regeneratively feeds back the energy stored in the reactor L102 to the direct current power supply PS1, so that the current I12 is reduced at a high speed from the peak current IP to the base current IB. Further, current I17 flows through the diode D102, the capacitor C101, the reactor L101, the diode D101 and the diode D105 and regeneratively feeds back the energy stored in the reactor L101 to the direct current power supply PS1, so that the current I17 is reduced at a high speed from the peak current IP to the base current IB. Thus, the current I13, as represented by current 223 of FIG. 19(g), is also reduced at a high speed from the peak current IP to the base current IB in a manner similar to the above.

When the current I12 is decreased from the peak current IP to the base current IB, it serves to cause the transistor TR103 to turn on at time t204 shown in FIG. 19(e) as depicted in FIG. 19(f). Further, the current I12 controls the conductivity of the transistor TR101 so as to be the base current IB.

In the above-described manner, the present embodiment can effectively provide the pulse electric power unit which can rise the base current IB at a high speed as shown in FIG. 19(h), block the peak current IP at a high speed and cause the discharge current to flow in form of the predetermined waveform, between the electrode 201 and the object 202 to be machined, thereby making it possible to achieve energy-saving.

Figure 20:
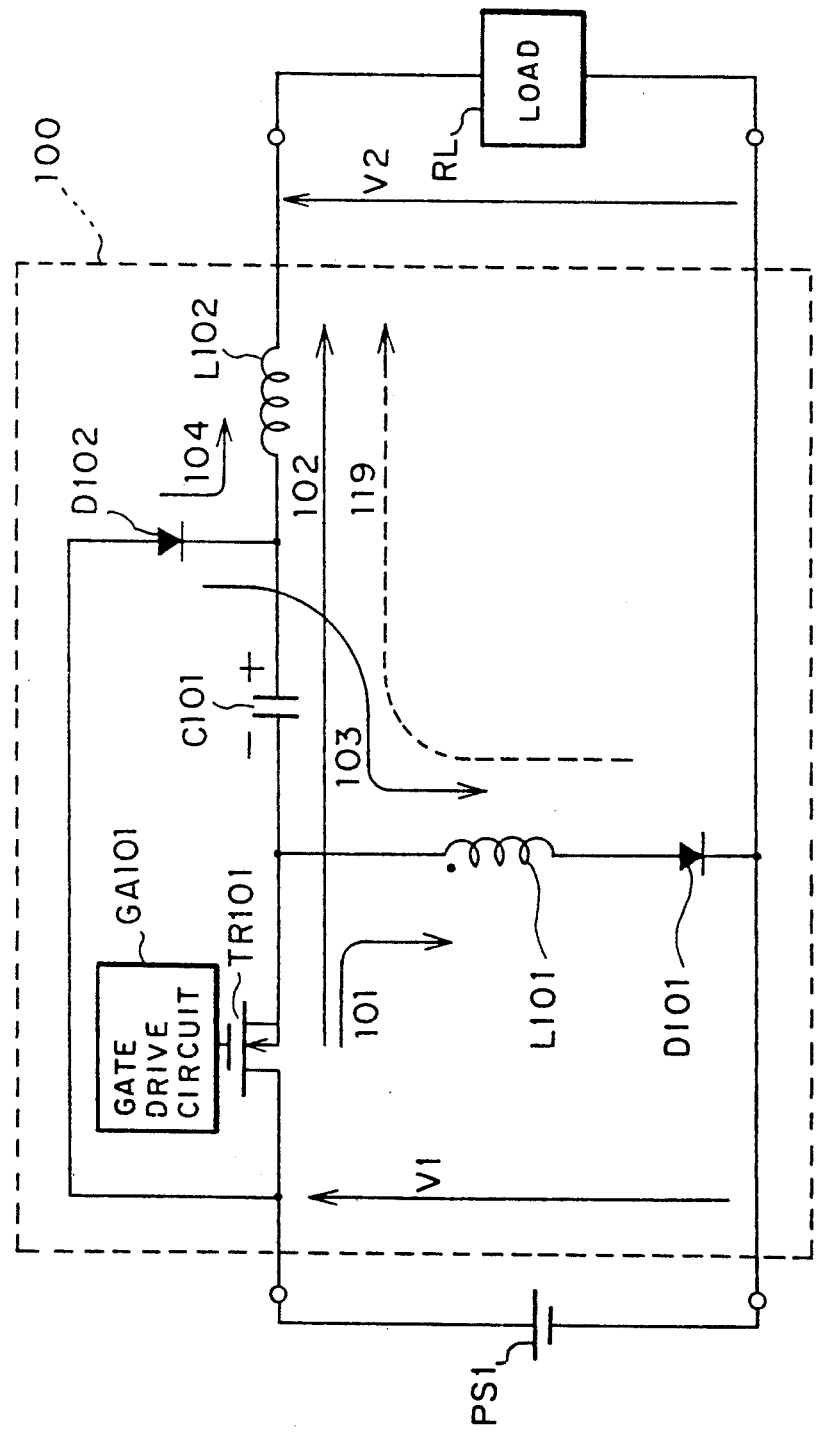
FIG. 20 is a circuit diagram showing the structure of a pulse electric power unit according to a third embodiment of this invention.

FIG. 20 is a circuit diagram showing the structure of a pulse electric power unit according to a third embodiment of this invention. The same reference numerals as those in FIG. 13 designate similar or corresponding parts, and their description will therefore be omitted. The circuit structure of the pulse electric power unit 100 shown in FIG. 20 is different from that in the pulse electric power unit 100 shown in FIG. 13 in that the position where a diode D102 employed in the circuit forming the pulse electric power unit 100 is joined or connected has been changed. More specifically, the pulse electric power unit 100 shown in FIG. 20 is of such a circuit structure that the anode of the diode D102 is connected to a nodal or junction point of the direct current power supply PS1 and a transistor TR101, and the cathode thereof is connected to the junction point of a capacitor C101 and a reactor L102.

A description will now be made of the operation of the pulse electric power unit 100 shown in FIG. 20 according to the third embodiment of this invention. When the transistor TR101 connected to the direct current power supply PS1 and whose conductivity is controlled by a gate drive circuit GA101 is turned on, current 101 indicated by the arrow flows through a reactor L101. Further, current 102 indicated by the arrow flows through the capacitor C101, a reactor L102 and a load RL. On the other hand, when the transistor TR101 is turned off, the current 101 indicated by the arrow is changed to current 103 indicated by the arrow. Then, this current 103 flows through the diode D102, the capacitor C101, the reactor L101 and a diode D101, and also charges the Capacitor C101.

When the transistor TR101 is turned on again, the current 101 further increases, and the current 102 flows through the transistor TR101, the capacitor C101, the reactor L102 into the load RL. At this time, the current 102 flows into the load RL in succession, so that the power conversion is effected.

Further, when the transistor TR101 is turned off, the increased current 101 is changed to the current 103, which in turn charges the capacitor C101 so as to be the polarity shown in FIG. 20. In addition, the current 102, which flows through the reactor L102, is changed to current 104, which in turn flows into the load RL in succession. The pulse electric power unit 100 is operated in the above-described manner so as to carry out the direct-current power conversion. When the pulse electric power unit 100 is in operation, the capacitor C101 is charged so as to be the polarity shown in FIG. 20. A voltage of the capacitor C101 to be charged or stored therein becomes twice the output voltage at the load RL.

Figure 21:
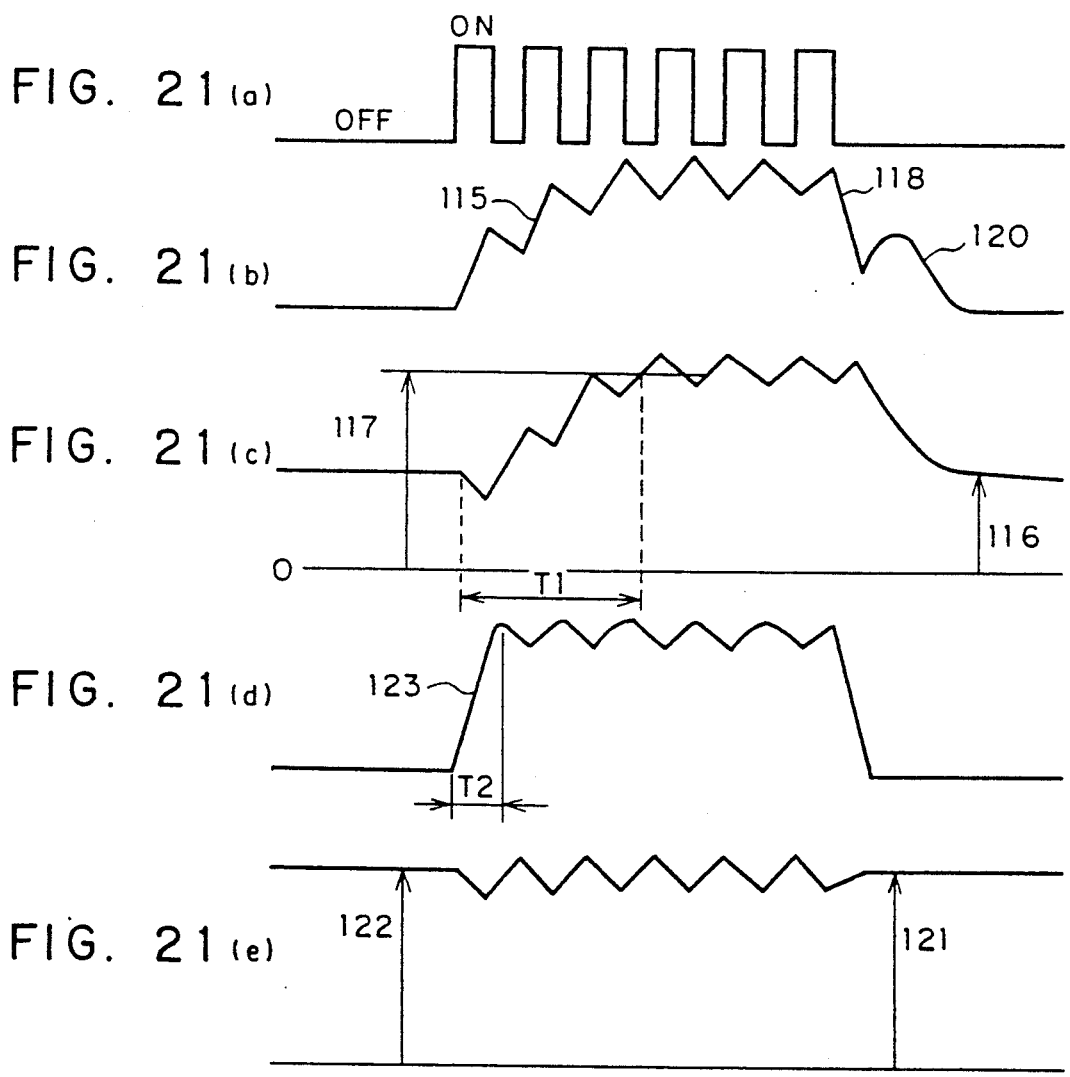
FIG. 21 is a timing chart for describing the operation of the pulse electric power unit shown in FIG. 20, the chart showing signals employed in respective parts of the pulse electric power unit.

FIG. 21 is a timing chart for describing the operation of the pulse electric power unit shown in FIG. 20, the chart showing signal employed in respective parts of the pulse electric power unit. In the same drawing, there are shown output currents 115, 118, 120 from the transistor TR101, voltages 117, 121, 122 each to be stored in the capacitor C101, and output current 123 at the load RL.

FIG. 21(a) shows an operation characteristic obtained when the transistor TR101 is turned on and off. First of all, a description will be made of the operation of the pulse electric power unit in a case where the diode D101 shown in FIG. 20 does not exist. When the pulse signal generator 7 shown in FIG. 2 is turned on to output an ON signal (the pulse signal 24) therefrom, the switching operation of the transistor TR101 is made in response to the signal shown in FIG. 21(a). As a consequence, the output current 115 from the transistor TR101 is increased as illustrated in FIG. 21(b). Further, a voltage stored in the capacitor C101 rises up to the voltage 117 as depicted in FIG. 21(c). Thus, the time required to charge the capacitor C101 is equal to the time T1 required for the output current 115 of the transistor TR101 to rise. The transistor TR101 should have the switching operations of 5 to 20 times in order to charge the capacitor C101. Therefore, the rise time T1 of the output current 115 becomes slow or long.

On the other hand, when the pulse signal generator 7 is turned off to output an OFF signal therefrom, the switching operation of the transistor TR101 is stopped in response to the signal shown in FIG. 21(a). As a result, the output current 118 of the transistor TR101 is reduced as shown in FIG. 21(b). With this operation, a voltage stored in the capacitor C101 is reduced from the voltage 117 to the voltage 116 as illustrated in FIG. 21(c). This results from the fact that the switching operation of the transistor TR101 is stopped and at the same time, discharge current 119 indicated by the arrow (broken line) of FIG. 20 flows, so that the voltage of the capacitor C101 is discharged. The irregular or improper output current 120 develops as shown in FIG. 21(b) because the discharge current 119 flows through the load RL. Such improper output current 120 shows a waveform of an output signal different from that of the signal 13 outputted from the command control unit 6.

However, if the diode D101 is inserted into the circuit as shown in FIG. 20, the above discharge current 119 which flows as reverse current of the diode D101 is prevented from flowing therein owing to the provision of the diode D101. Thus, the voltage stored in the capacitor C101 is no longer discharged and hence the voltage 122 of the capacitor C101 at the time that the switching operation of the transistor TR101 is effected remains unchanged as in the voltage 121 of the capacitor C101 shown in FIG. 21(e). Further, such improper output current 120 of the transistor TR101 as shown in FIG. 21(b) is no longer developed at the time of its fall. On the other hand, when the pulse signal 24 is in an ON state, i.e., a supplied state, the voltage 122 of the capacitor C101 shown in FIG. 21(e) is equal to the voltage 121. Thus, the time T2 required for the output current 123 of the load RL shown in FIG. 21(d) to rise changes sharply at a high speed.

Figure 22:
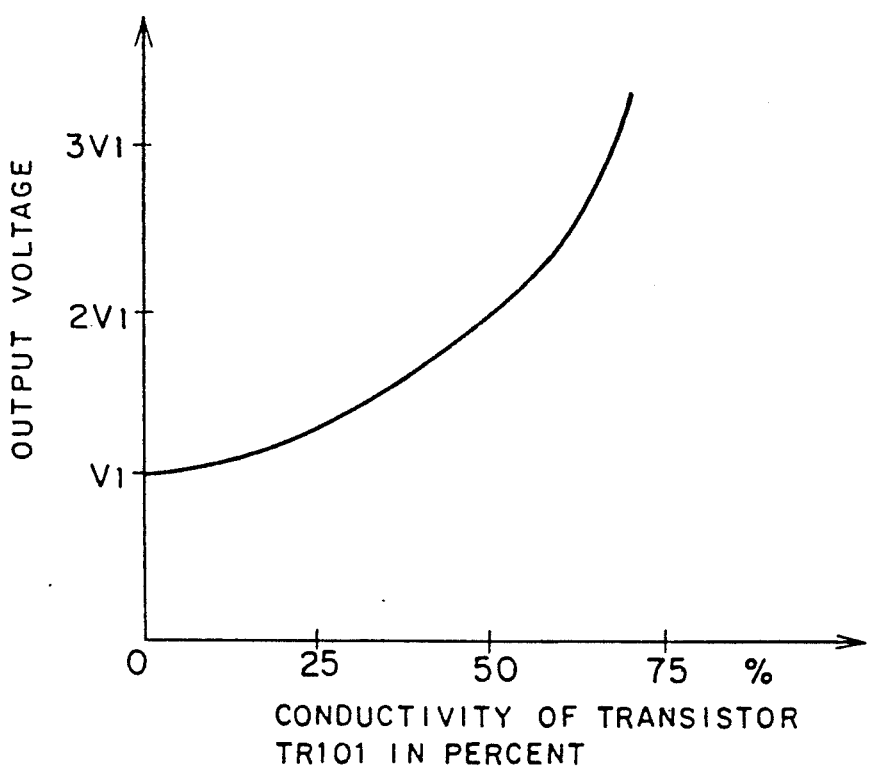
FIG. 22 is a graph for describing the characteristic of an output voltage from the pulse electric power unit of FIG. 20.

FIG. 22 is a graph for describing an output voltage characteristic obtained by the pulse electric power unit shown in FIG. 20. As represented by the output voltage characteristic of FIG. 22, the output voltage can arbitrarily be changed to a voltage of one to three times the voltage V1 of the direct current power supply PS1 according to a change in the conductivity of the transistor TR101.

Since the pulse electric power unit 100 shown in FIG. 20 uses the output voltage having the same polarity as that in the voltage of the direct current power supply PS1 contrary to the fact that the pulse electric power unit employing the conventional Cuk converter utilizes the output voltage having the polarity opposite to that in the voltage of the direct current power supply PS1, the pulse electric power unit 100 serving as the direct current power converter is superb as compared with the conventional pulse electric power unit. Further, the pulse electric power unit 100 shown in FIG. 20 can boost or raise the voltage V1 of the direct current power supply PS1 so as to be one to three times the voltage V1. Furthermore, the pulse electric power unit 100 can also reduce the ripple of the output voltage by magnetically connecting the reactors L101 and L102 to each other, thereby making it possible to obtain a superb pulse electric power unit as compared with the conventional electric power unit.

Figure 23:
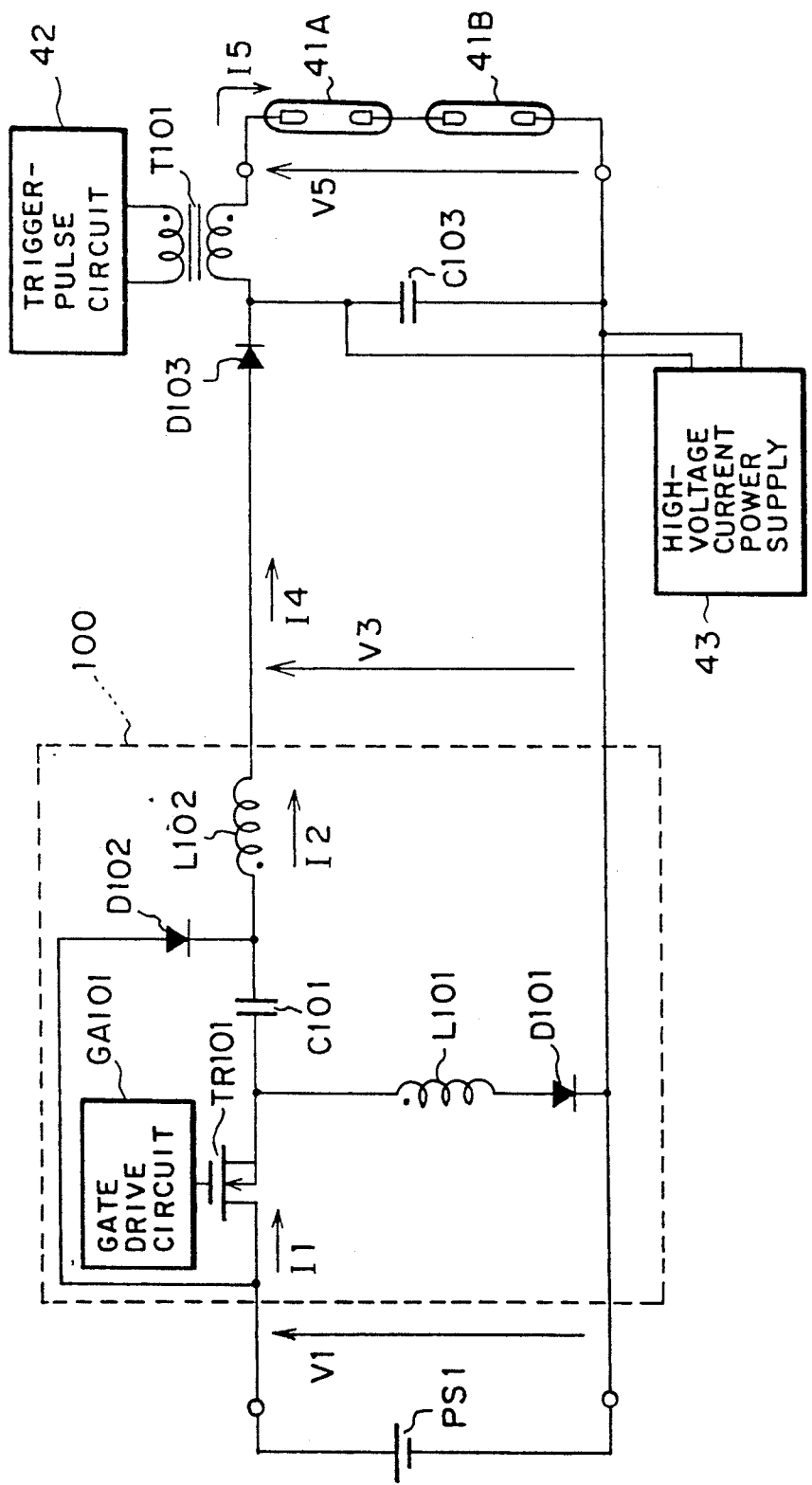
FIG. 23 is a circuit diagram showing one example of a pulse electric power unit used to illuminate an arc lamp for the YAG laser excitation, which is shown as an alternative to the pulse electric power unit of FIG. 20.

FIG. 23 is a circuit diagram showing one example of a pulse electric power unit used to illuminate an arc lamp for the YAG laser excitation, which is shown as an alternative to the pulse electric power unit of FIG. 20. The same reference numerals as those in FIG. 15 designate similar or corresponding parts, and their description will therefore be omitted. In the same drawing, designated at numerals 41A, 41B are arc lamps.

Figure 24:
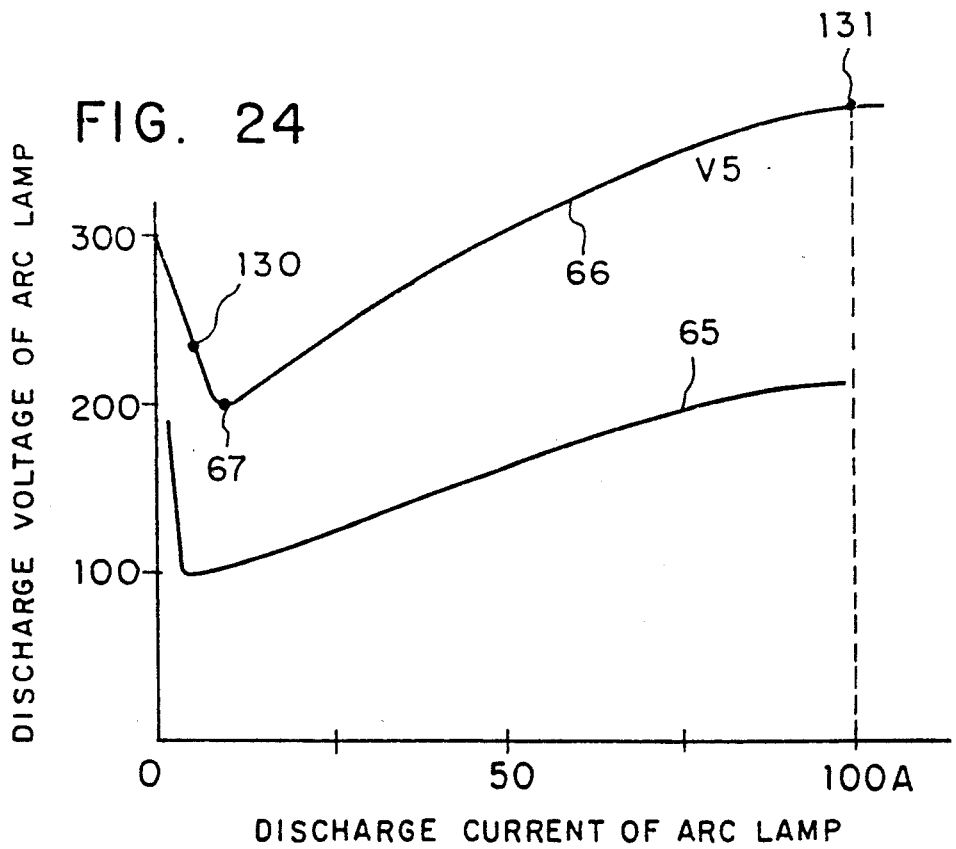
FIG. 24 is a graph for describing the characteristic of voltage vs. current of the arc lamp employed in the pulse electric power unit of FIG. 23.

FIG. 24 is a graph for describing characteristics of voltage vs. current of the arc lamp employed in the pulse electric power unit shown in FIG. 23. In FIG. 24, there are shown voltage vs. current characteristic curves 65, 66 of the arc lamp, the lowest discharge voltage point 67, a voltage operating point 131.

A description will now be made of the operation of the pulse electric power unit of FIG. 23 used to illuminate the arc lamp for the YAG laser excitation. A high voltage (which generally ranges from 800 V to 1500 V) is applied across the arc lamps 41A, 41B by a high-voltage direct current power supply 43 and a high-voltage pulse (which is generally 20 KV whose pulse width is 1 μs) is applied to a transformer T101 by a trigger-pulse circuit 42, thereby causing the discharge of the arc lamps 41A, 41B to be initiated.

When the discharge of each of the arc lamps 41A, 41B is initiated, the arc lamps 41A, 41B are always supplied with slight current based on the output current determined by the high-voltage direct current power supply 43. This slight current is generally called "Shimmer current".

A discharge voltage V5 becomes a relatively-low voltage having a range from 200 V to 300 V where the arc lamps 41A, 41B are illuminated by the shimmer current. The capacitor C103 is a relatively small-capacity type capacitor and serves to prevent the withstand voltage of the diode D103 from being destroyed by a trigger pulse. The capacitor C103 is used to prevent a high voltage supplied from the high-voltage direct current power supply 43 from flowing into the pulse electric power unit 100 when each of the arc lamps 41A, 41B are in a non-illuminated state.

Let's now look at the voltage vs. current characteristic curves of the arc lamps shown in FIG. 24 in a state in which the arc lamps 41A, 41B have been illuminated by the shimmer current as described above. Numeral 65 indicates a voltage vs. current characteristic curve of either one of the arc lamps 41A and 41B. Numeral 66 designates a voltage vs. current characteristic curve obtained when the arc lamps 41A and 41B ar connected in series to each other. The thus-obtained voltage corresponds to a voltage V5 shown in FIG. 23. The discharge characteristics of the arc lamps 41A, 41B are set such that the level at the minimum discharge voltage point 67 becomes higher than that of a voltage V1 of the direct current power supply PS1.

When the conductivity of the transistor TR101 is increased, output current I5 shown in FIG. 23 is raised. As a consequence, pulse output current having high-speed response can be produced as in output current 123 shown in FIG. 21(d), thereby making it possible to effectively supply discharge power to the arc lamps 41A, 41B. When one attempts to raise the conductivity of the transistor TR101 and cause the discharge current of, for example, 100 A(ampere) to flow in the arc lamps in a case where the discharge of each of the arc lamps 41A, 41B is being made at the voltage operating point 130 of the voltage vs. current characteristic curve 66 in a state in which each of the arc lamps 41A, 41B is illuminated by the shimmer current, the voltage operating point 130 is shifted to the voltage operating point 131. The discharge voltage V5 also becomes high correspondingly to thereby be substantially 400 V.

As described above, the pulse electric power unit 100 shown in FIG. 23 is practically employed in a case where the output voltage from the pulse electric power unit 100 is set to the voltage of one to three times the voltage V1 of the direct current power supply PS1. In particular, when the output voltage is raised up to a voltage of twice the voltage V1 thereof, the pulse electric power unit can provide a most suitable efficiency and is also suitable for the illumination of the arc lamp used for the YAG laser excitation. Thus, a small-size and low-cost pulse electric power unit can be achieved.

Figure 25:
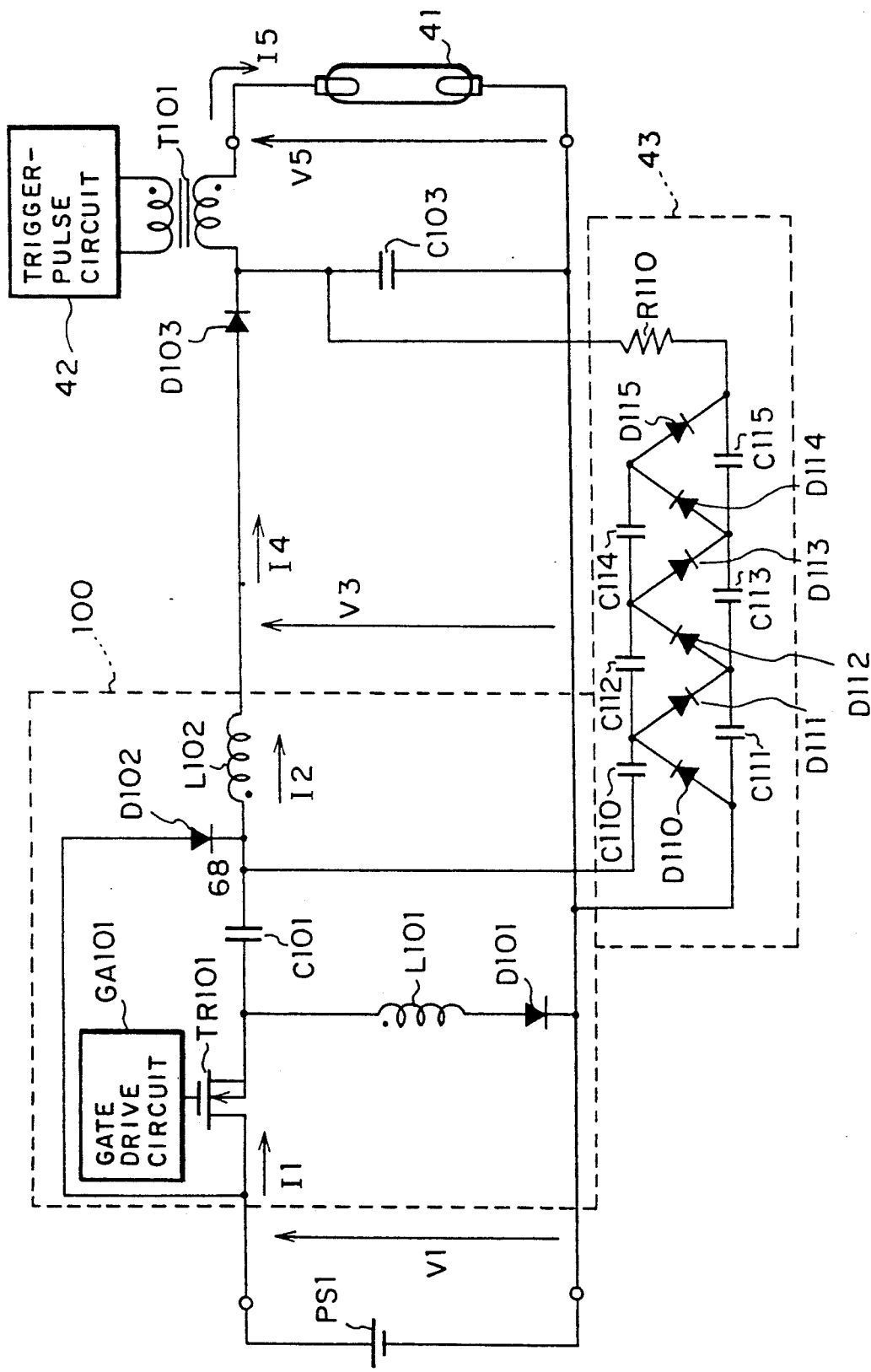
FIG. 25 is a circuit diagram showing the structure of the pulse electric power unit of FIG. 23 which is used to illuminate the arc lamp for the YAG laser excitation and equipped with a high-voltage direct current power supply mentioned by way of illustrative example.

FIG. 25 is a circuit diagram showing the structure of the pulse electric power unit of FIG. 23 equipped with an illustrated high-voltage direct current power supply, which is used to illuminate the arc lamps for the YAG laser excitation. The same reference numerals as those in FIG. 17 designate similar or corresponding parts, and their description will therefore be omitted. The high-voltage direct current power supply 43 shown in FIG. 25 is composed of capacitors C110 through C115, diodes D110 through D115, and a resistor R110. This high-voltage direct current power unit 43 provides a voltage doubler rectifying circuit which carries out voltage doubler rectification using as a power supply a voltage at the junction point of the diode D102 and the capacitor C101. For example, if the voltage at the junction point is about 200 V, the circuit described herein can output a voltage six times that voltage referred to above.

Such a voltage doubler rectifying circuit is referred to as "Cockcroft circuit". This circuit can obtain arbitrary high voltages by increasing the number of stages of the capacitor and diode. The capacitors C110 through C115 may be small capacitance with respect to the diode D102 since the switching operation of the transistor TR10 is effected at a high frequency. In addition, the resistor R110 is used to limit the output current from the voltage doubler rectifying circuit because the discharge voltage V5 drops when the discharge of the arc lamp 41 is made. A current-limiting function can also be incorporated in the cockcroft circuit itself by reducing the capacitance of each of the capacitors C110 through C115. The voltage doubler rectifying circuit employing such a cockcroft circuit can bring about an advantageous effect in that a power supply used for the voltage doubler rectifying circuit is obtained from the above junction point, so that the high-voltage direct current power supply 43 can be achieved in a simpler circuit form and at a low cost.

As has been described above, the pulse electric power unit according to the first embodiment of this invention comprises a direct current power converter having circuit components comprising a first diode, a first reactor and an electronically-operated switch all of which are serially connected in turn from a high-potential side to a low-potential side with respect to a direct current power supply; a serially-connected structure composed of a capacitor and a second diode connected in parallel with the switch; and a serially-connected structure composed of a second reactor and a load connected in parallel with the second diode. In addition, the output current is controlled at intervals by the above-described electrically-operated switch. Accordingly, the present invention can bring about an excellent effect in that a high-speed answerable or responsible pulse electric power unit can be obtained without particularly causing improper current over the output current by forming a simpler circuit in which a reverse-current blocking diode used to prevent the capacitor from being discharged is merely connected.

Further, the pulse electric power unit according to the second embodiment of this invention comprises a direct current power converter having circuit components comprising an electronically-operated switch, a first reactor and a first diode all of which are serially connected in turn from a high-potential side to a low-potential side with respect to a direct current power supply; a serially-connected structure composed of a capacitor and a second diode connected in parallel with a serially-connected structure composed of the first reactor and the first diode; and a serially-connected structure composed of a second reactor and a load connected in parallel with the second diode, the direct current power converter being capable of boosting or unboosting and having a regenerative function. In addition, the output current is controlled at intervals by the above-described electrically-operated switch. Accordingly, the present invention can bring about an excellent effect in that a pulse electric power unit that can effect the power conversion for boosting or unboosting the output voltage so as to be the same polarity as that of the voltage of the direct current power supply and that can provide a high-speed response without causing improper current over the output current in particular can be obtained by merely forming a simpler circuit.

Furthermore, the pulse electric power unit according to the third embodiment of this invention comprises a direct current power converter having circuit components comprising an electronically-operated switch, a first reactor and a first diode all of which are serially connected in turn from a high-potential side to a low-potential side with respect to a direct current power supply; a serially-connected structure composed of a capacitor and a second diode connected in parallel with the switch; and a serially-connected structure composed of a second reactor and a load connected in parallel with a serially-connected structure composed of the capacitor, the first reactor and the first diode, the direct current power converter being capable of boosting and having a regenerative function. In addition, the output current is controlled at intervals by the above-described electrically-operated switch. Accordingly, the present invention ca bring about an excellent effect in that a pulse electric power unit that can effect the power conversion for boosting the output voltage so as to be the same polarity as that of the voltage of the direct current power supply and that can provide a high-speed response without causing improper current over the output current in particular can be obtained by merely forming a simpler circuit.

Having now fully described the invention, it will be apparent to those skilled in the art that many changes and modifications can be made without departing from the spirit or scope of the invention as set forth herein.

What is claimed is:

1. A pulse electric power unit comprising a direct current power converter for converting an output voltage from a direct current power supply into a direct current voltage having arbitrary magnitude, said direct current power converter including circuit components which comprise:

an electronically-operated switch,
a first reactor,
a first diode,
said electronically-operated switch, said first reactor and said first diode being serially connected in turn from a high-potential side to a low-potential side with respect to said direct current power supply;
a serially-connected structure composed of a capacitor and a second diode which are connected in parallel with a serially-connected structure composed of said first reactor and said first diode; and
a serially-connected structure composed of a second reactor and a load which are connected in parallel with said second diode;
wherein said direct current power converter further includes a second electronically-operated switch connected between said second reactor and said load and for improving rise/fall response of said output pulse current, and a third diode connected between the junction point of said second reactor and said second electronically-operated switch and the high-potential side of said direct current power supply and for regeneratively feeding back the energy stored in said second reactor to said direct current power supply.

2. A pulse electric power unit according to claim 1, wherein said direct current power converter further includes a third electronically-operated switch connected between said first diode and said low-potential side of said direct current power supply and for improving the response of said output pulse current, and a fourth diode connected between the junction point of said first diode and said electronically-operated switch and said high-potential side of said direct current power supply and for regeneratively feeding back the energy stored in said first reactor to said direct current power supply.

* * * * *

UNITED STATES PATENT AND TRADEMARK OFFICE
CERTIFICATE OF CORRECTION

PATENT NO. : 5,164,892
DATED : November 17, 1992
INVENTOR(S) : Yoshihide Kimbara It is certified that error appears in the above-identified patent and that said Letters Patent is hereby corrected as shown below:

Column 1, line 13, "Cuk" should be --Ćuk--.

Column 7, line 6, "Cuk" should be --Ćuk--.

Column 9, line 51, "ar" should be --are--.

Column 10, line 22, "1" should be --12--.

Column 14, line 24, "V" should be --V5--;
line 68, "u p" should be --up--.

Column 16, line 34, "Capacitor" should be --capacitor--.

Column 20, line 57, "ca" should be --can--.

Signed and Sealed this

Thirtieth Day of November, 1993

Attest:

BRUCE LEHMAN

*Attesting Officer*     *Commissioner of Patents and Trademarks*